US011776788B2

(12) United States Patent
Yang et al.

(10) Patent No.: US 11,776,788 B2
(45) Date of Patent: Oct. 3, 2023

(54) PULSED VOLTAGE BOOST FOR SUBSTRATE PROCESSING

(71) Applicant: Applied Materials, Inc., Santa Clara, CA (US)

(72) Inventors: Yang Yang, San Diego, CA (US); Yue Guo, Redwood City, CA (US); Kartik Ramaswamy, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 178 days.

(21) Appl. No.: 17/361,178

(22) Filed: Jun. 28, 2021

(65) Prior Publication Data

US 2022/0415614 A1    Dec. 29, 2022

(51) Int. Cl.
*H01J 37/32*    (2006.01)

(52) U.S. Cl.
CPC .. *H01J 37/32091* (2013.01); *H01J 37/32128* (2013.01); *H01J 37/32174* (2013.01); *H01J 37/32568* (2013.01); *H01J 37/32577* (2013.01); *H01J 2237/334* (2013.01)

(58) Field of Classification Search
CPC .......... H01J 37/32091; H01J 37/32128; H01J 37/32174; H01J 37/32568; H01J 37/32577
See application file for complete search history.

(56) References Cited

U.S. PATENT DOCUMENTS

| | | | |
|---|---|---|---|
| 4,464,223 A | 8/1984 | Gorin | |
| 4,585,516 A | 4/1986 | Corn et al. | |
| 5,099,697 A | 3/1992 | Agar | |
| 5,242,561 A | 9/1993 | Sato | |
| 5,449,410 A | 9/1995 | Chang et al. | |

(Continued)

FOREIGN PATENT DOCUMENTS

| | | |
|---|---|---|
| CN | 101990353 A | 3/2011 |
| CN | 102084024 A | 6/2011 |

(Continued)

OTHER PUBLICATIONS

International Search Report/Written Opinion issued to PCT/US2022/030844 dated Sep. 27, 2022.

(Continued)

*Primary Examiner* — Tung X Le
(74) *Attorney, Agent, or Firm* — Patterson + Sheridan, LLP

(57) ABSTRACT

Embodiments provided herein generally include apparatus, plasma processing systems and methods for boosting a voltage of an electrode in a processing chamber. An example plasma processing system includes a processing chamber, a plurality of switches, an electrode disposed in the processing chamber, a voltage source, and a capacitive element. The voltage source is selectively coupled to the electrode via one of the plurality of switches. The capacitive element is selectively coupled to the electrode via one of the plurality of switches. The capacitive element and the voltage source are coupled to the electrode in parallel. The plurality of switches are configured to couple the capacitive element and the voltage source to the electrode during a first phase, couple the capacitive element and the electrode to a ground node during a second phase, and couple the capacitive element to the electrode during a third phase.

29 Claims, 13 Drawing Sheets

(56) References Cited

U.S. PATENT DOCUMENTS

| | | |
|---|---|---|
| 5,464,499 A | 11/1995 | Moslehi et al. |
| 5,565,036 A | 10/1996 | Westendorp et al. |
| 5,595,627 A | 1/1997 | Inazawa et al. |
| 5,597,438 A | 1/1997 | Grewal et al. |
| 5,698,062 A | 12/1997 | Sakamoto et al. |
| 5,716,534 A | 2/1998 | Tsuchiya et al. |
| 5,810,982 A | 9/1998 | Sellers |
| 5,830,330 A | 11/1998 | Lantsman |
| 5,882,424 A | 3/1999 | Taylor et al. |
| 5,928,963 A | 7/1999 | Koshiishi |
| 5,933,314 A | 8/1999 | Lambson et al. |
| 5,935,373 A | 8/1999 | Koshimizu |
| 5,948,704 A | 9/1999 | Benjamin et al. |
| 5,997,687 A | 12/1999 | Koshimizu |
| 6,043,607 A | 3/2000 | Roderick |
| 6,055,150 A | 4/2000 | Clinton et al. |
| 6,074,518 A | 6/2000 | Imafuku et al. |
| 6,089,181 A | 7/2000 | Suemasa et al. |
| 6,110,287 A | 8/2000 | Arai et al. |
| 6,117,279 A | 9/2000 | Smolanoff et al. |
| 6,125,025 A | 9/2000 | Howald et al. |
| 6,133,557 A | 10/2000 | Kawanabe et al. |
| 6,136,387 A | 10/2000 | Koizumi |
| 6,197,151 B1 | 3/2001 | Kaji et al. |
| 6,198,616 B1 | 3/2001 | Dahimene et al. |
| 6,202,590 B1 | 3/2001 | Kim et al. |
| 6,214,162 B1 | 4/2001 | Koshimizu |
| 6,232,236 B1 | 5/2001 | Shan et al. |
| 6,252,354 B1 | 6/2001 | Collins et al. |
| 6,277,506 B1 | 8/2001 | Okamoto |
| 6,309,978 B1 | 10/2001 | Donohoe et al. |
| 6,313,583 B1 | 11/2001 | Arita et al. |
| 6,358,573 B1 | 3/2002 | Raoux et al. |
| 6,367,413 B1 | 4/2002 | Sill et al. |
| 6,395,641 B2 | 5/2002 | Savas |
| 6,413,358 B2 | 7/2002 | Donohoe |
| 6,423,192 B1 | 7/2002 | Wada et al. |
| 6,433,297 B1 | 8/2002 | Kojima et al. |
| 6,435,131 B1 | 8/2002 | Koizumi |
| 6,451,389 B1 | 9/2002 | Amann et al. |
| 6,456,010 B2 | 9/2002 | Yamakoshi et al. |
| 6,535,785 B2 | 3/2003 | Johnson et al. |
| 6,621,674 B1 | 9/2003 | Zahringer et al. |
| 6,664,739 B1 | 12/2003 | Kishinevsky et al. |
| 6,733,624 B2 | 5/2004 | Koshiishi et al. |
| 6,740,842 B2 | 5/2004 | Johnson et al. |
| 6,741,446 B2 | 5/2004 | Ennis |
| 6,818,103 B1 | 11/2004 | Scholl et al. |
| 6,818,257 B2 | 11/2004 | Amann et al. |
| 6,830,595 B2 | 12/2004 | Reynolds, III |
| 6,849,154 B2 | 2/2005 | Nagahata et al. |
| 6,861,373 B2 | 3/2005 | Aoki et al. |
| 6,896,775 B2 | 5/2005 | Chistyakov |
| 6,917,204 B2 | 7/2005 | Mitrovic et al. |
| 6,962,664 B2 | 11/2005 | Mitrovic |
| 6,970,042 B2 | 11/2005 | Glueck |
| 6,972,524 B1 | 12/2005 | Marakhtanov et al. |
| 7,016,620 B2 | 3/2006 | Maess et al. |
| 7,046,088 B2 | 5/2006 | Ziegler |
| 7,059,267 B2 | 6/2006 | Hedberg et al. |
| 7,104,217 B2 | 9/2006 | Himor et al. |
| 7,147,759 B2 | 12/2006 | Chistyakov |
| 7,151,242 B2 | 12/2006 | Schuler |
| 7,166,233 B2 | 1/2007 | Johnson et al. |
| 7,183,177 B2 | 2/2007 | Al-Bayati et al. |
| 7,206,189 B2 | 4/2007 | Reynolds, III |
| 7,218,503 B2 | 5/2007 | Howald |
| 7,218,872 B2 | 5/2007 | Shimomura |
| 7,226,868 B2 | 6/2007 | Mosden et al. |
| 7,265,963 B2 | 9/2007 | Hirose |
| 7,274,266 B2 | 9/2007 | Kirchmeier |
| 7,305,311 B2 | 12/2007 | van Zyl |
| 7,312,974 B2 | 12/2007 | Kuchimachi |
| 7,408,329 B2 | 8/2008 | Wiedemuth et al. |
| 7,415,940 B2 | 8/2008 | Koshimizu et al. |
| 7,440,301 B2 | 10/2008 | Kirchmeier et al. |
| 7,452,443 B2 | 11/2008 | Gluck et al. |
| 7,479,712 B2 | 1/2009 | Richert |
| 7,509,105 B2 | 3/2009 | Ziegler |
| 7,512,387 B2 | 3/2009 | Glueck |
| 7,535,688 B2 | 5/2009 | Yokouchi et al. |
| 7,586,099 B2 | 9/2009 | Eyhorn et al. |
| 7,586,210 B2 | 9/2009 | Wiedemuth et al. |
| 7,588,667 B2 | 9/2009 | Cerio, Jr. |
| 7,601,246 B2 | 10/2009 | Kim et al. |
| 7,609,740 B2 | 10/2009 | Glueck |
| 7,618,686 B2 | 11/2009 | Colpo |
| 7,645,341 B2 | 1/2010 | Kennedy et al. |
| 7,651,586 B2 | 1/2010 | Moriya et al. |
| 7,652,901 B2 | 1/2010 | Kirchmeier et al. |
| 7,692,936 B2 | 4/2010 | Richter |
| 7,700,474 B2 | 4/2010 | Cerio, Jr. |
| 7,705,676 B2 | 4/2010 | Kirchmeier et al. |
| 7,706,907 B2 | 4/2010 | Hiroki |
| 7,740,704 B2 | 6/2010 | Strang |
| 7,758,764 B2 | 7/2010 | Dhindsa et al. |
| 7,761,247 B2 | 7/2010 | van Zyl |
| 7,782,100 B2 | 8/2010 | Steuber et al. |
| 7,795,817 B2 | 9/2010 | Nitschke |
| 7,821,767 B2 | 10/2010 | Fujii |
| 7,858,533 B2 | 12/2010 | Liu et al. |
| 7,898,238 B2 | 3/2011 | Wiedemuth et al. |
| 7,929,261 B2 | 4/2011 | Wiedemuth |
| RE42,362 E | 5/2011 | Schuler |
| 7,977,256 B2 | 7/2011 | Liu et al. |
| 7,988,816 B2 | 8/2011 | Koshiishi et al. |
| 7,995,313 B2 | 8/2011 | Nitschke |
| 8,044,595 B2 | 10/2011 | Nitschke |
| 3,055,203 A1 | 11/2011 | Choueiry et al. |
| 8,052,798 B2 | 11/2011 | Moriya et al. |
| 8,083,961 B2 | 12/2011 | Chen et al. |
| 8,110,992 B2 | 2/2012 | Nitschke |
| 8,128,831 B2 | 3/2012 | Sato et al. |
| 8,133,347 B2 | 3/2012 | Gluck et al. |
| 8,140,292 B2 | 3/2012 | Wendt |
| 8,221,582 B2 | 7/2012 | Patrick et al. |
| 8,236,109 B2 | 8/2012 | Moriya et al. |
| 8,313,612 B2 | 11/2012 | McMillin et al. |
| 8,313,664 B2 | 11/2012 | Chen et al. |
| 8,333,114 B2 | 12/2012 | Hayashi |
| 8,384,403 B2 | 2/2013 | Zollner et al. |
| 8,399,366 B1 | 3/2013 | Takaba |
| 8,419,959 B2 | 4/2013 | Bettencourt et al. |
| 8,441,772 B2 | 5/2013 | Yoshikawa et al. |
| 8,456,220 B2 | 6/2013 | Thome et al. |
| 8,460,567 B2 | 6/2013 | Chen |
| 8,466,622 B2 | 6/2013 | Knaus |
| 8,542,076 B2 | 9/2013 | Maier |
| 8,551,289 B2 | 10/2013 | Nishimura et al. |
| 8,568,606 B2 | 10/2013 | Ohse et al. |
| 8,603,293 B2 * | 12/2013 | Koshiishi ......... H01J 37/32018 156/345.43 |
| 8,641,916 B2 | 2/2014 | Yatsuda et al. |
| 8,685,267 B2 | 4/2014 | Yatsuda et al. |
| 8,716,114 B2 | 5/2014 | Ohmi et al. |
| 8,735,291 B2 | 5/2014 | Ranjan et al. |
| 8,796,933 B2 | 8/2014 | Hermanns |
| 8,809,199 B2 | 8/2014 | Nishizuka |
| 8,821,684 B2 | 9/2014 | Ui et al. |
| 8,852,347 B2 | 10/2014 | Lee et al. |
| 8,884,523 B2 | 11/2014 | Winterhalter et al. |
| 8,884,525 B2 | 11/2014 | Hoffman et al. |
| 8,889,534 B1 | 11/2014 | Ventzek et al. |
| 8,895,942 B2 | 11/2014 | Liu et al. |
| 8,907,259 B2 | 12/2014 | Kasai et al. |
| 8,993,943 B2 | 3/2015 | Pohl et al. |
| 9,011,636 B2 | 4/2015 | Ashida |
| 9,053,908 B2 | 6/2015 | Sriraman et al. |
| 9,059,178 B2 | 6/2015 | Matsumoto et al. |
| 9,087,798 B2 | 7/2015 | Ohtake et al. |
| 9,123,762 B2 | 9/2015 | Lin et al. |
| 9,139,910 B2 | 9/2015 | Lee et al. |
| 9,147,555 B2 | 9/2015 | Richter |
| 9,159,575 B2 | 10/2015 | Ranjan et al. |

(56) References Cited

U.S. PATENT DOCUMENTS

| | | |
|---|---|---|
| 9,209,032 B2 | 12/2015 | Zhao et al. |
| 9,209,034 B2 | 12/2015 | Kitamura et al. |
| 9,287,086 B2 | 3/2016 | Brouk et al. |
| 9,313,872 B2 | 4/2016 | Yamazawa |
| 9,355,822 B2 | 5/2016 | Yamada et al. |
| 9,373,521 B2 | 6/2016 | Mochiki et al. |
| 9,384,992 B2 | 7/2016 | Narishige et al. |
| 9,396,960 B2 | 7/2016 | Ogawa et al. |
| 9,404,176 B2 | 8/2016 | Parkhe et al. |
| 9,435,029 B2 | 9/2016 | Brouk et al. |
| 9,496,150 B2 | 11/2016 | Mochiki et al. |
| 9,503,006 B2 | 11/2016 | Pohl et al. |
| 9,530,667 B2 | 12/2016 | Rastogi et al. |
| 9,564,287 B2 | 2/2017 | Ohse et al. |
| 9,570,313 B2 | 2/2017 | Ranjan et al. |
| 9,576,810 B2 | 2/2017 | Deshmukh et al. |
| 9,576,816 B2 | 2/2017 | Rastogi et al. |
| 9,593,421 B2 | 3/2017 | Baek et al. |
| 9,607,843 B2 | 3/2017 | Rastogi et al. |
| 9,637,814 B2 | 5/2017 | Bugyi et al. |
| 9,644,221 B2 | 5/2017 | Kanamori et al. |
| 9,663,858 B2 | 5/2017 | Nagami et al. |
| 9,666,446 B2 | 5/2017 | Tominaga et al. |
| 9,666,447 B2 | 5/2017 | Rastogi et al. |
| 9,673,027 B2 | 6/2017 | Yamamoto et al. |
| 9,673,059 B2 | 6/2017 | Raley et al. |
| 9,685,297 B2 | 6/2017 | Carter et al. |
| 9,734,992 B2 | 8/2017 | Yamada et al. |
| 9,754,768 B2 | 9/2017 | Yamada et al. |
| 9,761,419 B2 | 9/2017 | Nagami |
| 9,786,503 B2 | 10/2017 | Raley et al. |
| 9,788,405 B2 | 10/2017 | Kawasaki et al. |
| 9,799,494 B2 | 10/2017 | Chen et al. |
| 9,805,916 B2 | 10/2017 | Konno et al. |
| 9,805,965 B2 | 10/2017 | Sadjadi et al. |
| 9,831,064 B2 | 11/2017 | Konno et al. |
| 9,837,285 B2 | 12/2017 | Tomura et al. |
| 9,840,770 B2 | 12/2017 | Klimczak et al. |
| 9,865,471 B2 | 1/2018 | Shimoda et al. |
| 9,865,893 B2 | 1/2018 | Esswein et al. |
| 9,870,898 B2 | 1/2018 | Urakawa et al. |
| 9,922,802 B2 | 3/2018 | Hirano et al. |
| 9,922,806 B2 | 3/2018 | Tomura et al. |
| 9,941,097 B2 | 4/2018 | Yamazawa et al. |
| 9,941,098 B2 | 4/2018 | Nagami |
| 9,972,503 B2 | 5/2018 | Tomura et al. |
| 9,997,374 B2 | 6/2018 | Takeda et al. |
| 10,109,461 B2 | 10/2018 | Yamada et al. |
| 10,176,970 B2 | 1/2019 | Nitschke |
| 10,199,246 B2 | 2/2019 | Koizumi et al. |
| 10,217,933 B2 | 2/2019 | Nishimura et al. |
| 10,229,819 B2 | 3/2019 | Hirano et al. |
| 10,268,846 B2 | 4/2019 | Miller et al. |
| 10,282,567 B2 | 5/2019 | Miller et al. |
| 10,283,321 B2 | 5/2019 | Yang et al. |
| 10,304,661 B2 | 5/2019 | Ziemba et al. |
| 10,312,056 B2 | 6/2019 | Collins et al. |
| 10,320,373 B2 | 6/2019 | Prager et al. |
| 10,348,186 B2 | 7/2019 | Schuler et al. |
| 10,373,755 B2 | 8/2019 | Prager et al. |
| 10,382,022 B2 | 8/2019 | Prager et al. |
| 10,387,166 B2 | 8/2019 | Preston et al. |
| 10,389,345 B2 | 8/2019 | Ziemba et al. |
| 10,460,910 B2 | 10/2019 | Ziemba et al. |
| 10,460,911 B2 | 10/2019 | Ziemba et al. |
| 10,483,089 B2 | 11/2019 | Ziemba et al. |
| 10,483,100 B2 | 11/2019 | Ishizaka et al. |
| 10,510,575 B2 | 12/2019 | Kraus et al. |
| 10,522,343 B2 | 12/2019 | Tapily et al. |
| 10,593,519 B2 | 3/2020 | Yamada et al. |
| 10,607,814 B2 | 3/2020 | Ziemba et al. |
| 10,658,189 B2 | 5/2020 | Hatazaki et al. |
| 10,659,019 B2 | 5/2020 | Slobodov et al. |
| 10,665,434 B2 | 5/2020 | Matsumoto et al. |
| 10,666,198 B2 | 5/2020 | Prager et al. |
| 10,672,596 B2 | 6/2020 | Brcka |
| 10,672,616 B2 | 6/2020 | Kubota |
| 10,707,053 B2 | 7/2020 | Urakawa et al. |
| 10,707,054 B1 | 7/2020 | Kubota |
| 10,707,055 B2 | 7/2020 | Shaw et al. |
| 10,707,086 B2 | 7/2020 | Yang et al. |
| 10,707,090 B2 | 7/2020 | Takayama et al. |
| 10,707,864 B2 | 7/2020 | Miller et al. |
| 10,714,372 B2 | 7/2020 | Chua et al. |
| 10,720,305 B2 | 7/2020 | Van Zyl |
| 10,734,906 B2 | 8/2020 | Miller et al. |
| 10,748,746 B2 | 8/2020 | Kaneko et al. |
| 10,755,894 B2 | 8/2020 | Hirano et al. |
| 10,763,150 B2 | 9/2020 | Lindley et al. |
| 10,773,282 B2 | 9/2020 | Coppa et al. |
| 10,774,423 B2 | 9/2020 | Janakiraman et al. |
| 10,777,388 B2 | 9/2020 | Ziemba et al. |
| 10,790,816 B2 | 9/2020 | Ziemba et al. |
| 10,796,887 B2 | 10/2020 | Prager et al. |
| 10,804,886 B2 | 10/2020 | Miller et al. |
| 10,811,227 B2 | 10/2020 | Van Zyl et al. |
| 10,811,228 B2 | 10/2020 | Van Zyl et al. |
| 10,811,229 B2 | 10/2020 | Van Zyl et al. |
| 10,811,230 B2 | 10/2020 | Ziemba et al. |
| 10,811,296 B2 | 10/2020 | Cho et al. |
| 10,847,346 B2 | 11/2020 | Ziemba et al. |
| 10,892,140 B2 | 1/2021 | Ziemba et al. |
| 10,892,141 B2 | 1/2021 | Ziemba et al. |
| 10,896,807 B2 | 1/2021 | Fairbairn et al. |
| 10,896,809 B2 | 1/2021 | Ziemba et al. |
| 10,903,047 B2 | 1/2021 | Ziemba et al. |
| 10,904,996 B2 | 1/2021 | Koh et al. |
| 10,916,408 B2 | 2/2021 | Dorf et al. |
| 10,923,320 B2 | 2/2021 | Koh et al. |
| 10,923,321 B2 | 2/2021 | Dorf et al. |
| 10,923,367 B2 | 2/2021 | Lubomirsky et al. |
| 10,923,379 B2 | 2/2021 | Liu et al. |
| 10,971,342 B2 | 4/2021 | Engelstaedter et al. |
| 10,978,274 B2 | 4/2021 | Kubota |
| 10,978,955 B2 | 4/2021 | Ziemba et al. |
| 10,985,740 B2 | 4/2021 | Prager et al. |
| 10,991,553 B2 | 4/2021 | Ziemba et al. |
| 10,991,554 B2 * | 4/2021 | Zhao ............... H01J 37/32146 |
| 10,998,169 B2 | 5/2021 | Ventzek et al. |
| 11,004,660 B2 | 5/2021 | Prager et al. |
| 11,011,349 B2 | 5/2021 | Brouk et al. |
| 11,075,058 B2 | 7/2021 | Ziemba et al. |
| 11,095,280 B2 | 8/2021 | Ziemba et al. |
| 11,101,108 B2 | 8/2021 | Slobodov et al. |
| 11,108,384 B2 | 8/2021 | Prager et al. |
| 11,476,090 B1 | 10/2022 | Ramaswamy et al. |
| 2001/0009139 A1 | 7/2001 | Shan et al. |
| 2001/0033755 A1 | 10/2001 | Ino et al. |
| 2003/0049558 A1 | 3/2003 | Aoki et al. |
| 2003/0052085 A1 | 3/2003 | Parsons |
| 2003/0079983 A1 | 5/2003 | Long |
| 2003/0091355 A1 | 5/2003 | Jeschonek et al. |
| 2003/0151372 A1 | 8/2003 | Tsuchiya et al. |
| 2003/0165044 A1 | 9/2003 | Yamamoto |
| 2003/0201069 A1 | 10/2003 | Johnson |
| 2004/0040665 A1 | 3/2004 | Mizuno et al. |
| 2004/0040931 A1 | 3/2004 | Koshiishi et al. |
| 2004/0112536 A1 | 6/2004 | Quon |
| 2004/0223284 A1 | 11/2004 | Iwami et al. |
| 2005/0022933 A1 | 2/2005 | Howard |
| 2005/0024809 A1 | 2/2005 | Kuchimachi |
| 2005/0039852 A1 | 2/2005 | Roche et al. |
| 2005/0098118 A1 | 5/2005 | Amann et al. |
| 2005/0151544 A1 | 7/2005 | Mahoney et al. |
| 2005/0286916 A1 | 12/2005 | Nakazato et al. |
| 2006/0171848 A1 | 8/2006 | Roche et al. |
| 2007/0113787 A1 | 5/2007 | Higashiura et al. |
| 2007/0284344 A1 | 12/2007 | Todorov et al. |
| 2008/0012548 A1 | 1/2008 | Gerhardt et al. |
| 2008/0048498 A1 | 2/2008 | Wiedemuth et al. |
| 2008/0160212 A1 | 7/2008 | Koo |
| 2008/0185537 A1 | 8/2008 | Walther et al. |
| 2008/0236493 A1 | 10/2008 | Sakao |

(56) References Cited

U.S. PATENT DOCUMENTS

| | | | |
|---|---|---|---|
| 2008/0236750 A1* | 10/2008 | Koshimizu | B08B 7/0042 118/723 VE |
| 2009/0059462 A1 | 3/2009 | Mizuno et al. | |
| 2009/0078678 A1 | 3/2009 | Kojima | |
| 2009/0133839 A1 | 5/2009 | Yamazawa et al. | |
| 2009/0236214 A1 | 9/2009 | Janakiraman et al. | |
| 2010/0018648 A1 | 1/2010 | Collins et al. | |
| 2010/0025230 A1 | 2/2010 | Ehiasarian et al. | |
| 2010/0029038 A1 | 2/2010 | Murakawa | |
| 2010/0118464 A1 | 5/2010 | Matsuyama | |
| 2010/0154994 A1 | 6/2010 | Fischer et al. | |
| 2010/0321047 A1 | 12/2010 | Zollner et al. | |
| 2010/0326957 A1 | 12/2010 | Maeda et al. | |
| 2011/0143537 A1 | 6/2011 | Lee et al. | |
| 2011/0177669 A1 | 7/2011 | Lee et al. | |
| 2011/0177694 A1 | 7/2011 | Chen et al. | |
| 2011/0298376 A1 | 12/2011 | Kanegae | |
| 2012/0145186 A1* | 6/2012 | Koshimizu | B08B 7/0042 134/1.1 |
| 2012/0171390 A1 | 7/2012 | Nauman | |
| 2013/0059448 A1 | 3/2013 | Marakhtanov | |
| 2013/0087447 A1 | 4/2013 | Bodke et al. | |
| 2013/0214828 A1 | 8/2013 | Valcore, Jr. et al. | |
| 2013/0340938 A1 | 12/2013 | Tappan et al. | |
| 2013/0344702 A1 | 12/2013 | Nishizuka | |
| 2014/0057447 A1 | 2/2014 | Yang | |
| 2014/0061156 A1 | 3/2014 | Brouk et al. | |
| 2014/0117861 A1 | 5/2014 | Finley et al. | |
| 2014/0125315 A1 | 5/2014 | Kirchmeier et al. | |
| 2014/0356984 A1 | 12/2014 | Ventzek et al. | |
| 2015/0002018 A1 | 1/2015 | Lill et al. | |
| 2015/0111394 A1 | 4/2015 | Hsu | |
| 2015/0130354 A1 | 5/2015 | Leray et al. | |
| 2015/0235809 A1 | 8/2015 | Ito et al. | |
| 2015/0366004 A1 | 12/2015 | Nangoy et al. | |
| 2016/0004475 A1 | 1/2016 | Beniyama et al. | |
| 2016/0027678 A1 | 1/2016 | Parkhe et al. | |
| 2016/0196958 A1 | 7/2016 | Leray et al. | |
| 2016/0284514 A1 | 9/2016 | Hirano | |
| 2016/0351375 A1 | 12/2016 | Valcore, Jr. et al. | |
| 2016/0358755 A1 | 12/2016 | Long et al. | |
| 2017/0098527 A1 | 4/2017 | Kawasaki et al. | |
| 2017/0162417 A1 | 6/2017 | Ye et al. | |
| 2017/0221682 A1 | 8/2017 | Nishimura et al. | |
| 2017/0330734 A1 | 11/2017 | Lee et al. | |
| 2018/0076032 A1 | 3/2018 | Wang et al. | |
| 2018/0139834 A1 | 5/2018 | Nagashima et al. | |
| 2018/0190501 A1 | 7/2018 | Ueda | |
| 2018/0204708 A1* | 7/2018 | Tan | H01J 37/32715 |
| 2018/0309423 A1 | 10/2018 | Okunishi et al. | |
| 2018/0366305 A1 | 12/2018 | Nagami et al. | |
| 2018/0374672 A1 | 12/2018 | Hayashi et al. | |
| 2019/0027344 A1 | 1/2019 | Okunishi et al. | |
| 2019/0090338 A1 | 3/2019 | Koh et al. | |
| 2019/0157044 A1 | 5/2019 | Ziemba et al. | |
| 2019/0172688 A1 | 6/2019 | Ueda | |
| 2019/0198333 A1 | 6/2019 | Tokashiki | |
| 2019/0259562 A1 | 8/2019 | Dorf et al. | |
| 2019/0267218 A1 | 8/2019 | Wang et al. | |
| 2019/0277804 A1 | 9/2019 | Prager et al. | |
| 2019/0295769 A1 | 9/2019 | Prager et al. | |
| 2019/0295819 A1 | 9/2019 | Okunishi et al. | |
| 2019/0318918 A1 | 10/2019 | Saitoh et al. | |
| 2019/0333741 A1* | 10/2019 | Nagami | H01J 37/32091 |
| 2019/0341232 A1 | 11/2019 | Thokachichu et al. | |
| 2019/0348263 A1 | 11/2019 | Okunishi | |
| 2019/0363388 A1 | 11/2019 | Esswein et al. | |
| 2019/0385822 A1 | 12/2019 | Marakhtanov et al. | |
| 2019/0393791 A1 | 12/2019 | Ziemba et al. | |
| 2020/0016109 A1 | 1/2020 | Feng et al. | |
| 2020/0024330 A1 | 1/2020 | Chan-Hui et al. | |
| 2020/0035457 A1 | 1/2020 | Ziemba et al. | |
| 2020/0035458 A1 | 1/2020 | Ziemba et al. | |
| 2020/0035459 A1 | 1/2020 | Ziemba et al. | |
| 2020/0036367 A1 | 1/2020 | Slobodov et al. | |
| 2020/0037468 A1 | 1/2020 | Ziemba et al. | |
| 2020/0051785 A1 | 2/2020 | Miller et al. | |
| 2020/0051786 A1 | 2/2020 | Ziemba et al. | |
| 2020/0058475 A1 | 2/2020 | Engelstaedter et al. | |
| 2020/0066497 A1 | 2/2020 | Engelstaedter et al. | |
| 2020/0066498 A1 | 2/2020 | Engelstaedter et al. | |
| 2020/0075293 A1 | 3/2020 | Ventzek et al. | |
| 2020/0090905 A1 | 3/2020 | Brouk et al. | |
| 2020/0106137 A1 | 4/2020 | Murphy et al. | |
| 2020/0126760 A1 | 4/2020 | Ziemba et al. | |
| 2020/0126837 A1 | 4/2020 | Kuno et al. | |
| 2020/0144030 A1 | 5/2020 | Prager et al. | |
| 2020/0154556 A1 | 5/2020 | Dorf et al. | |
| 2020/0161091 A1 | 5/2020 | Ziemba et al. | |
| 2020/0162061 A1 | 5/2020 | Prager et al. | |
| 2020/0168436 A1 | 5/2020 | Ziemba et al. | |
| 2020/0168437 A1 | 5/2020 | Ziemba et al. | |
| 2020/0176221 A1 | 6/2020 | Prager et al. | |
| 2020/0227230 A1 | 7/2020 | Ziemba et al. | |
| 2020/0227289 A1 | 7/2020 | Song et al. | |
| 2020/0234922 A1 | 7/2020 | Dorf | |
| 2020/0234923 A1 | 7/2020 | Dorf | |
| 2020/0251371 A1 | 8/2020 | Kuno et al. | |
| 2020/0266035 A1 | 8/2020 | Nagaiwa | |
| 2020/0294770 A1 | 9/2020 | Kubota | |
| 2020/0328739 A1 | 10/2020 | Miller et al. | |
| 2020/0357607 A1 | 11/2020 | Ziemba et al. | |
| 2020/0373114 A1 | 11/2020 | Prager et al. | |
| 2020/0389126 A1 | 12/2020 | Prager et al. | |
| 2020/0407840 A1 | 12/2020 | Hayashi et al. | |
| 2020/0411286 A1 | 12/2020 | Koshimizu et al. | |
| 2021/0005428 A1 | 1/2021 | Shaw et al. | |
| 2021/0013006 A1 | 1/2021 | Nguyen et al. | |
| 2021/0013011 A1 | 1/2021 | Prager et al. | |
| 2021/0013874 A1 | 1/2021 | Miller et al. | |
| 2021/0027990 A1 | 1/2021 | Ziemba et al. | |
| 2021/0029815 A1 | 1/2021 | Bowman et al. | |
| 2021/0043472 A1 | 2/2021 | Koshimizu et al. | |
| 2021/0051792 A1 | 2/2021 | Dokan et al. | |
| 2021/0066042 A1 | 3/2021 | Ziemba et al. | |
| 2021/0082669 A1 | 3/2021 | Koshiishi et al. | |
| 2021/0091759 A1 | 3/2021 | Prager et al. | |
| 2021/0125812 A1 | 4/2021 | Ziemba et al. | |
| 2021/0130955 A1 | 5/2021 | Nagaike et al. | |
| 2021/0140044 A1* | 5/2021 | Nagaike | C23C 16/401 |
| 2021/0151295 A1 | 5/2021 | Ziemba et al. | |
| 2021/0152163 A1 | 5/2021 | Miller et al. | |
| 2021/0210313 A1 | 7/2021 | Ziemba et al. | |
| 2021/0210315 A1 | 7/2021 | Ziemba et al. | |
| 2021/0249227 A1 | 8/2021 | Bowman et al. | |
| 2021/0272775 A1 | 9/2021 | Koshimizu | |
| 2021/0288582 A1 | 9/2021 | Ziemba et al. | |
| 2022/0392750 A1 | 12/2022 | Yang et al. | |
| 2022/0399183 A1 | 12/2022 | Cui et al. | |
| 2022/0399186 A1 | 12/2022 | Cui et al. | |
| 2022/0399189 A1 | 12/2022 | Guo et al. | |
| 2022/0406567 A1 | 12/2022 | Yang et al. | |
| 2022/0415614 A1 | 12/2022 | Yang et al. | |
| 2023/0087307 A1 | 3/2023 | Guo et al. | |

FOREIGN PATENT DOCUMENTS

| | | |
|---|---|---|
| CN | 105408993 A | 3/2016 |
| JP | 2014112644 A | 6/2014 |
| KR | 100757347 B1 | 9/2007 |
| TW | 201717247 A | 5/2017 |
| WO | 2018111751 A1 | 6/2018 |
| WO | 2020216741 A1 | 10/2020 |
| WO | 2020263673 A1 | 12/2020 |

OTHER PUBLICATIONS

The International Search Report and the Written Opinion for International Application No. PCT/US2021/040380; dated Oct. 27, 2021; 10 pages.

International Search Report and Written Opinion dated Feb. 4, 2022 for Application No. PCT/US2021/054806.

(56) References Cited

OTHER PUBLICATIONS

International Search Report and Written Opinion dated Feb. 4, 2022 for Application No. PCT/US2021/054814.
U.S. Appl. No. 63/210,956, filed Jun. 15, 2021.
U.S. Appl. No. 17/537,314, filed Nov. 29, 2021.
U.S. Appl. No. 63/242,410, filed Sep. 9, 2021.
Chinese Office Action for 201880053380.1 dated Dec. 2, 2021.
U.S. Appl. No. 17/537, 107, filed Nov. 29, 2021.
Taiwan Office Action for 108132682 (APPM/44016030TW01 dated Mar. 24, 2022.

* cited by examiner

PULSED VOLTAGE BOOST FOR SUBSTRATE PROCESSING

BACKGROUND

Field

Embodiments of the present disclosure generally relate to a system used in semiconductor device manufacturing. More specifically, embodiments of the present disclosure relate to a plasma processing system used to process a substrate.

Description of the Related Art

Reliably producing high aspect ratio features is one of the key technology challenges for the next generation of semiconductor devices. One method of forming high aspect ratio features uses a plasma-assisted etching process in which a plasma is formed in a processing chamber and ions from the plasma are accelerated towards a surface of a substrate to form openings in a material layer disposed beneath a mask layer formed on the surface of the substrate.

In a typical plasma-assisted etching process, the substrate is positioned on a substrate support disposed in a processing chamber, a plasma is formed over the substrate, and ions are accelerated from the plasma towards the substrate across a plasma sheath, i.e., region depleted of electrons, formed between the plasma and the surface of the substrate.

It has been found that pulsing techniques have to periodically and suddenly consume a large amount of plasma generated bulk electrons to establish the DC bias, and the amount of bulk electrons consumed is often on the order of the number of free electrons found in the generated plasma. Therefore, the consumption of bulk electrons cause severe perturbation to plasma stability and sometimes cause the plasma to extinguish. As an example, assume a plasma processing system has a plasma density of 5e10 $cm^{-3}$, gap of 2 cm (1 inch gap minus sheath thickness, about 0.5 cm) and wafer diameter of 30 cm. In such a system, the total available electrons in the volume above the wafer is 7e13. Further assume a sheath capacitance of 200 pF and sheath voltage of 8000V (typical for high aspect ratio etch applications). The number of electrons used to charge the wafer surface is about 1e13. So in about tens of nanoseconds, about 15 percent of the bulk electrons is drawn from the plasma to establish the DC bias. This consumption repeats at the pulsing frequency, which may be around 400 kHz. The bulk electron consumption is a significant perturbation to plasma sustainability and stability. This scenario may only worsen with the evolving processes using higher ion energies. During processing, variations in the plasma created by plasma instability will affect the with-in-wafer (WIW) and wafer-to-wafer (WTW) process performance, and thus device yield and other related process results.

Accordingly, there is a need in the art for plasma processing and biasing methods that are able to provide desirable plasma-assisted etching process results.

SUMMARY

Embodiments provided herein generally include apparatus, plasma processing systems and methods for generation of a waveform for plasma processing of a substrate in a processing chamber.

One embodiment of the present disclosure is directed to a plasma processing system. The plasma processing system generally includes a processing chamber, a plurality of switches, an electrode disposed in the processing chamber, a voltage source, and a capacitive element. The voltage source is selectively coupled to the electrode via one of the plurality of switches. The capacitive element is selectively coupled to the electrode via one of the plurality of switches. The capacitive element and the voltage source are coupled to the electrode in parallel. The plurality of switches are configured to couple the capacitive element and the voltage source to the electrode during a first phase, couple the capacitive element and the electrode to a ground node during a second phase, and couple the capacitive element to the electrode during a third phase.

One embodiment of the present disclosure is directed to a method of processing a substrate. The method generally includes coupling a capacitive element and a voltage source to an electrode disposed within a processing chamber during a first phase, where the capacitive element and the voltage source are coupled to the electrode in parallel. The method also includes coupling the capacitive element and the electrode to a ground node during a second phase. The method further includes coupling the capacitive element to the electrode during a third phase.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope and may admit to other equally effective embodiments.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

With technology node advancing towards 2 nm, fabrication of smaller features with larger aspect ratios involve atomic precision for plasma processing. For etching processes where the plasma ions play an important role, ion energy control is challenging the semiconductor equipment industry. Traditionally, RF biased techniques use a sinusoidal wave to excite plasma and accelerate ions.

Some embodiments of the present disclosure are generally directed to techniques and apparatus that use the concept of a charge pump to increase wafer surface voltage without or reduced consumption of plasma electrons. In certain aspects, the electrons from an external circuit (such as a capacitive element coupled in parallel with the electrode of the processing chamber) may be used to boost the DC bias at the electrode. The techniques and apparatus for boosting the DC bias at the electrode described herein may reduce the load to plasma electrons and/or facilitate higher energy substrate processing operations.

Plasma Processing System Examples

Figure 1:
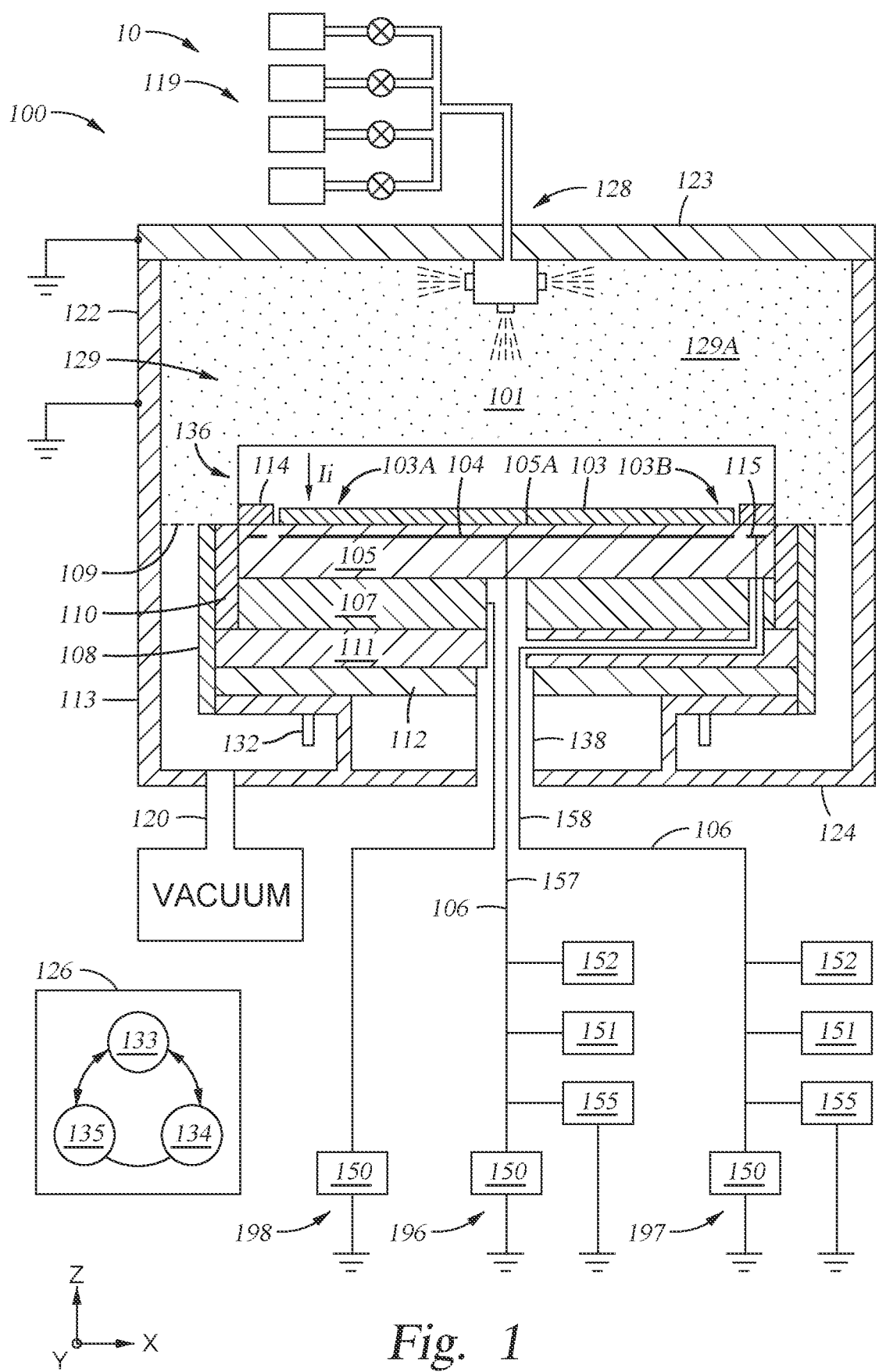
FIG. 1 is a schematic cross-sectional view of a processing system, according to one or more embodiments, configured to practice the methods set forth herein.

FIG. 1 is a schematic cross-sectional view of a plasma processing system 10 configured to perform one or more of the plasma processing methods set forth herein. In some embodiments, the processing system 10 is configured for plasma-assisted etching processes, such as a reactive ion etch (RIE) plasma processing. However, it should be noted that the embodiments described herein may be also be used with processing systems configured for use in other plasma-assisted processes, such as plasma-enhanced deposition processes, for example, plasma-enhanced chemical vapor deposition (PECVD) processes, plasma-enhanced physical vapor deposition (PEPVD) processes, plasma-enhanced atomic layer deposition (PEALD) processes, plasma treatment processing or plasma-based ion implant processing, for example, plasma doping (PLAD) processing.

As shown, the processing system 10 is configured to form a capacitively coupled plasma (CCP), where the processing chamber 100 include an upper electrode (e.g., chamber lid 123) disposed in a processing volume 129 facing a lower electrode (e.g., the substrate support assembly 136) also disposed in the processing volume 129. In a typical capacitively coupled plasma (CCP) processing system, a radio frequency (RF) source is electrically coupled to one of the upper or lower electrode delivers an RF signal configured to ignite and maintain a plasma (e.g., the plasma 101), which is capacitively coupled to each of the upper and lower electrodes and is disposed in a processing region therebetween. Typically, the opposing one of the upper or lower electrodes is coupled to ground or to a second RF power source for additional plasma excitation. As shown, the processing system 10 includes a processing chamber 100, a support assembly 136, and a system controller 126.

The processing chamber 100 typically includes a chamber body 113 that includes the chamber lid 123, one or more sidewalls 122, and a chamber base 124, which collectively define the processing volume 129. The one or more sidewalls 122 and chamber base 124 generally include materials that are sized and shaped to form the structural support for the elements of the processing chamber 100 and are configured to withstand the pressures and added energy applied to them while a plasma 101 is generated within a vacuum environment maintained in the processing volume 129 of the processing chamber 100 during processing. In one example, the one or more sidewalls 122 and chamber base 124 are formed from a metal, such as aluminum, an aluminum alloy, or a stainless steel alloy.

A gas inlet 128 disposed through the chamber lid 123 is used to deliver one or more processing gases to the processing volume 129 from a processing gas source 119 that is in fluid communication therewith. A substrate 103 is loaded into, and removed from, the processing volume 129 through an opening (not shown) in one of the one or more sidewalls 122, which is sealed with a slit valve (not shown) during plasma processing of the substrate 103.

In some embodiments, a plurality of lift pins (not shown) movably disposed through openings formed in the substrate support assembly 136 are used to facilitate substrate transfer to and from a substrate supporting surface 105A. In some embodiments, the plurality of lift pins 132 are disposed above and are coupled to and/or are engageable with a lift pin hoop (not shown) disposed in the processing volume 129. The lift pin hoop may be coupled to a shaft (not shown) that sealingly extends through the chamber base 124. The shaft may be coupled to an actuator (not shown) that is used to raise and lower the lift pin hoop. When the lift pin hoop is in a raised position, it engages with the plurality of lift pins 132 to raise the upper surfaces of the lift pins above the substrate supporting surface 105A, lifting the substrate 103 therefrom and enabling access to a non-active (backside) surface the substrate 103 by a robot handler (not shown). When the lift pin hoop is in a lowered position, the plurality of lift pins 132 are flush with or recessed below the substrate supporting surface 105A, and the substrate 103 rests thereon.

The system controller 126, also referred to herein as a processing chamber controller, includes a central processing unit (CPU) 133, a memory 134, and support circuits 135. The system controller 126 is used to control the process sequence used to process the substrate 103, including the substrate biasing and/or voltage boosting method(s) described herein. The CPU 133 is a general-purpose computer processor configured for use in an industrial setting for controlling the processing chamber and sub-processors related thereto. The memory 134 described herein, which is generally non-volatile memory, may include random access memory, read-only memory, floppy or hard disk drive, or other suitable forms of digital storage, local or remote. The support circuits 135 are conventionally coupled to the CPU 133 and comprise cache, clock circuits, input/output subsystems, power supplies, and the like, and combinations thereof. Software instructions (program) and data can be coded and stored within the memory 134 for instructing a processor within the CPU 133. A software program (or computer instructions) readable by CPU 133 in the system controller 126 determines which tasks are performable by the components in the processing system 10.

Typically, the program, which is readable by CPU 133 in the system controller 126, includes code, which, when executed by the processor (CPU 133), performs tasks relating to the plasma processing schemes described herein. The program may include instructions that are used to control the various hardware and electrical components within the processing system 10 to perform the various process tasks and various process sequences used to implement the methods described herein. In one embodiment, the program includes instructions that are used to perform one or more of the operations described below in relation to FIG. 7.

Figure 4:
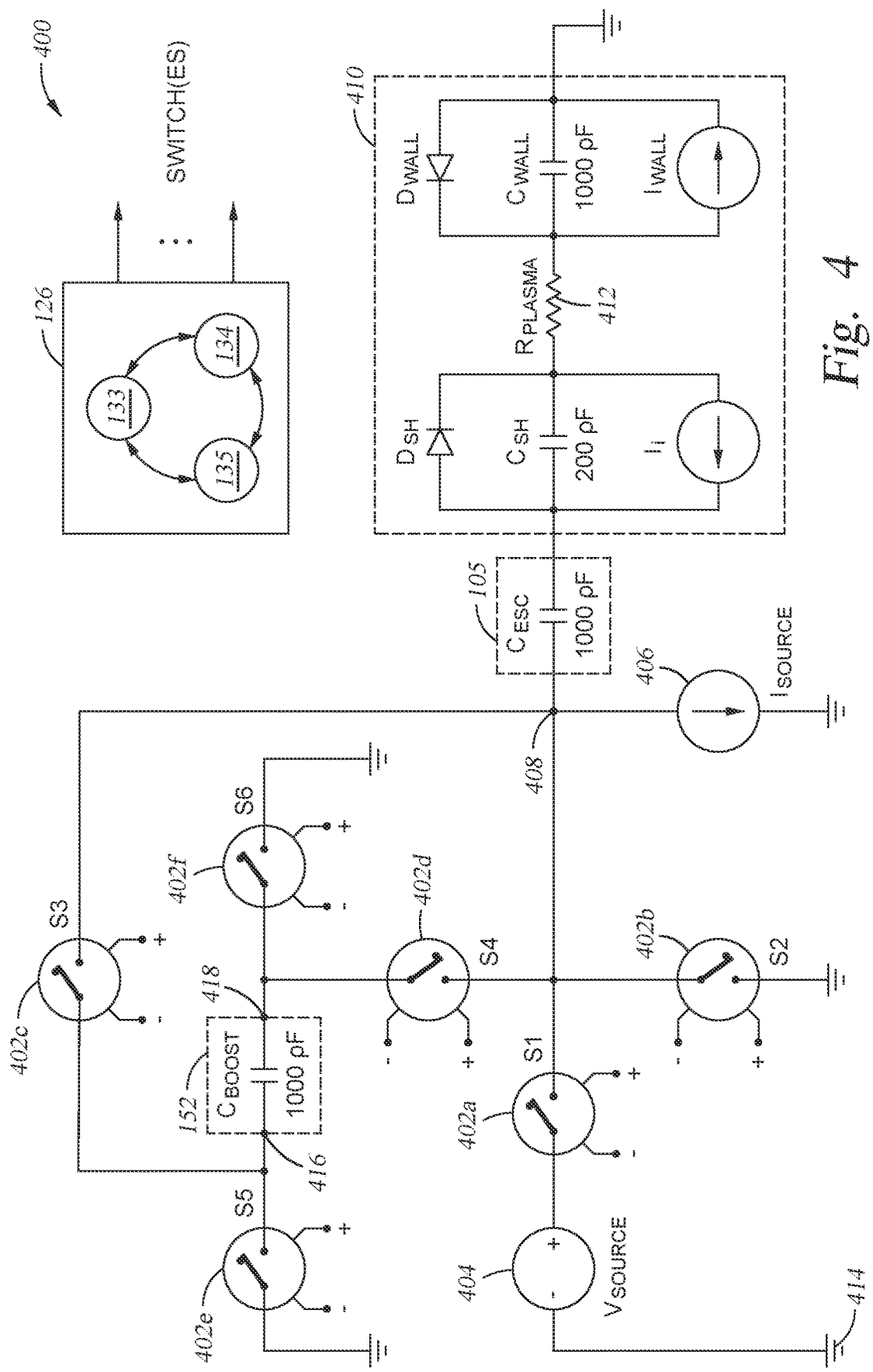
FIG. 4 illustrates a functionally equivalent, simplified electrical circuit of a plasma processing system that may establish a voltage boost at an electrode, in accordance with certain embodiments of the present disclosure

The plasma control system generally includes a first source assembly 196 for establishing at least a first pulsed voltage (PV) waveform at a bias electrode 104 (on a complex load as depicted in FIG. 4), and a second source assembly 197 for establishing at least a second PV waveform at an edge control electrode 115. The first PV waveform or the second PV waveform may be generated using one or more components (e.g., PV sources) within a waveform generator assembly 150, which may correspond to a voltage source and/or current source as described in more detail herein with respect to FIG. 4. In some embodiments, the waveform generator delivers an RF signal to the support base 107 (e.g., power electrode or cathode) and/or bias electrode 104 which may be used to generate (maintain and/or ignite) a plasma 101 in a processing region disposed between the substrate support assembly 136 and the chamber lid 123. In some embodiments, as shown in FIG. 1, a separate waveform generator assembly 150 within a third source assembly 198 includes at least an RF source that is configured to deliver an RF signal to the support base 107 (e.g., power electrode or cathode).

The applied RF signal provided from the first source assembly 196, the second source assembly 197 or the third source assembly 198 may be configured to generate (maintain and/or ignite) a plasma 101 in a processing region disposed between the substrate support assembly 136 and the chamber lid 123. In some embodiments, the RF signal is used to ignite and maintain a processing plasma 101 using the processing gases disposed in the processing volume 129 and fields generated by the RF power (RF signal) delivered to the support base 107 and/or bias electrode 104. In some aspects, the RF signal may be generated by an RF source (not shown) disposed within the waveform generator assembly 150. The processing volume 129 is fluidly coupled to one or more dedicated vacuum pumps through a vacuum outlet 120, which maintain the processing volume 129 at subatmospheric pressure conditions and evacuate processing and/or other gases, therefrom. In some embodiments, the substrate support assembly 136, disposed in the processing volume 129, is disposed on a support shaft 138 that is grounded and extends through the chamber base 124. In some embodiments, the RF signal generator may be configured to deliver an RF signal having a frequency that is greater than 40 MHz, such as between about 40 MHz and about 200 MHz.

In some embodiments, a capacitive element 152 may be selectively coupled to the bias electrode 104 and/or the support base 107, as further described herein with respect to FIG. 4. In certain cases, the capacitive element 152 may be electrically coupled to the bias electrode 104 and/or the support base 107 via the power delivery line 157. The capacitive element 152 may provide a voltage boost during ESC recharge stage to reduce the bulk electrons consumed from the plasma. The voltage boost may reduce or prevent the perturbation to plasma sustainability and stability caused by the consumption of bulk electrons from the plasma.

The substrate support assembly 136, as briefly discussed above, generally includes the substrate support 105 (e.g., an electrostatic chuck (ESC) substrate support) and support base 107. In some embodiments, the substrate support assembly 136 can additionally include an insulator plate 111 and a ground plate 112, as is discussed further below. The support base 107 is electrically isolated from the chamber base 124 by the insulator plate 111, and the ground plate 112 is interposed between the insulator plate 111 and the chamber base 124. The substrate support 105 is thermally coupled to and disposed on the support base 107. In some embodiments, the support base 107 is configured to regulate the temperature of the substrate support 105, and the substrate 103 disposed on the substrate support 105, during substrate processing. In some embodiments, the support base 107 includes one or more cooling channels (not shown) disposed therein that are fluidly coupled to, and in fluid communication with, a coolant source (not shown), such as a refrigerant source or water source having a relatively high electrical resistance. In some embodiments, the substrate support 105 includes a heater (not shown), such as a resistive heating element embedded in the dielectric material thereof. Herein, the support base 107 is formed of a corrosion-resistant thermally conductive material, such as a corrosion-resistant metal, for example aluminum, an aluminum alloy, or a stainless steel and is coupled to the substrate support with an adhesive or by mechanical means.

Typically, the substrate support 105 is formed of a dielectric material, such as a bulk sintered ceramic material, such as a corrosion-resistant metal oxide or metal nitride material, for example, aluminum oxide ($Al_2O_3$), aluminum nitride (AlN), titanium oxide (TiO), titanium nitride (TiN), yttrium oxide ($Y_2O_3$), mixtures thereof, or combinations thereof. In embodiments herein, the substrate support 105 further includes the bias electrode 104 embedded in the dielectric material thereof.

In one configuration, the bias electrode 104 is a chucking pole used to secure (i.e., chuck) the substrate 103 to the substrate supporting surface 105A of the substrate support 105 and to bias the substrate 103 with respect to the processing plasma 101 using one or more of the pulsed-voltage biasing schemes described herein. Typically, the bias electrode 104 is formed of one or more electrically conductive parts, such as one or more metal meshes, foils, plates, or combinations thereof.

In some embodiments, the bias electrode 104 is electrically coupled to a clamping network, which provides a chucking voltage thereto, such as static DC voltage between about −5000 V and about 5000 V, using an electrical conductor, such as the coaxial power delivery line 106 (e.g., a coaxial cable). As will be discussed further below, the clamping network includes a DC power supply 155 (e.g., a high voltage DC (HVDC) supply) and a filter 151 (e.g., a low-pass filter).

The substrate support assembly 136 may further include the edge control electrode 115 that is positioned below the edge ring 114 and surrounds the bias electrode 104 and/or is disposed a distance from a center of the bias electrode 104. In general, for a processing chamber 100 that is configured to process circular substrates, the edge control electrode 115 is annular in shape, is made from a conductive material, and is configured to surround at least a portion of the bias electrode 104. In some embodiments, such as shown in FIG. 1, the edge control electrode 115 is positioned within a region of the substrate support 105. In some embodiments, as illustrated in FIG. 1, the edge control electrode 115 includes a conductive mesh, foil, and/or plate that is disposed a similar distance (i.e., Z-direction) from the substrate supporting surface 105A of the substrate support 105 as the bias electrode 104.

The edge control electrode 115 can be biased by use of a waveform generator assembly that is different from the waveform generator assembly 150, which is used to bias the bias electrode 104. In some embodiments, the edge control electrode 115 can be biased by use of a waveform generator assembly 150 that is also used to bias the bias electrode 104 by splitting part of the power to the edge control electrode 115. In one configuration, a first waveform generator assembly 150 of the first source assembly 196 is configured to bias the bias electrode 104, and a second waveform generator assembly 150 of a second source assembly 197 is configured to bias the edge control electrode 115.

In one embodiment, a power delivery line 157 electrically connects the output of the waveform generator assembly 150 of the first source assembly 196 to the bias electrode 104. While the discussion below primarily discusses the power delivery line 157 of the first source assembly 196, which is used to couple a waveform generator assembly 150 to the bias electrode 104, the power delivery line 158 of the second source assembly 197, which couples a waveform generator assembly 150 to the edge control electrode 115, will include the same or similar components. The electrical conductor(s) within the various parts of the power delivery line 157 may include: (a) one or a combination of coaxial cables, such as a flexible coaxial cable that is connected in series with a rigid coaxial cable, (b) an insulated high-voltage corona-resistant hookup wire, (c) a bare wire, (d) a metal rod, (e) an electrical connector, or (f) any combination of electrical elements in (a)-(e).

In some embodiments, the processing chamber 100 further includes the quartz pipe 110, or collar, that at least partially circumscribes portions of the substrate support assembly 136 to prevent the substrate support 105 and/or the support base 107 from contact with corrosive processing gases or plasma, cleaning gases or plasma, or byproducts thereof. Typically, the quartz pipe 110, the insulator plate 111, and the ground plate 112 are circumscribed by a liner 108. In some embodiments, a plasma screen 109 is positioned between the cathode liner 108 and the sidewalls 122 to prevent plasma from forming in a volume underneath the plasma screen 109 between the liner 108 and the one or more sidewalls 122.

Figure 2A:
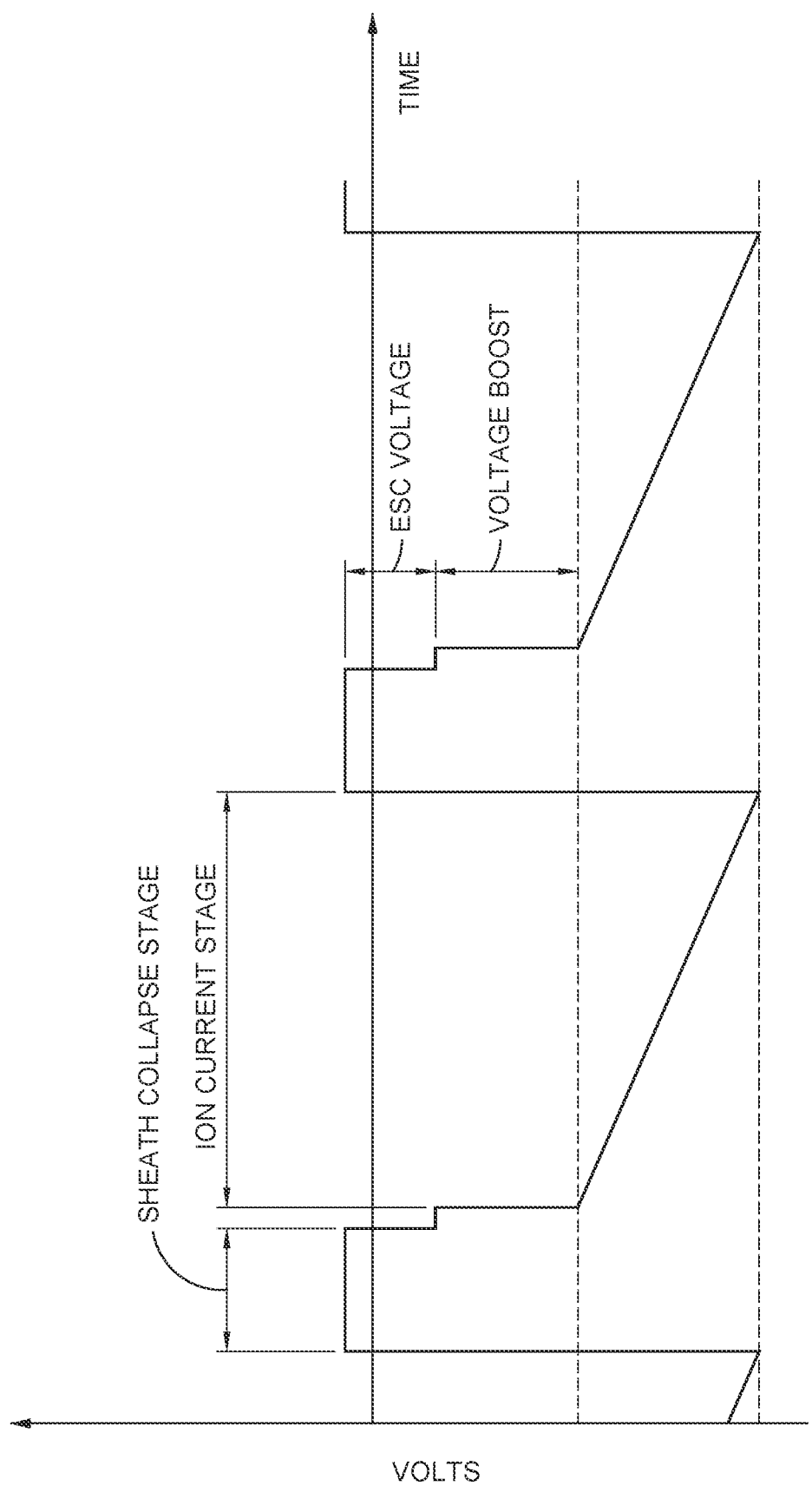
FIG. 2A shows a voltage waveform that may be applied to an electrode of a processing chamber, according to one or more embodiments.
Figure 2B:
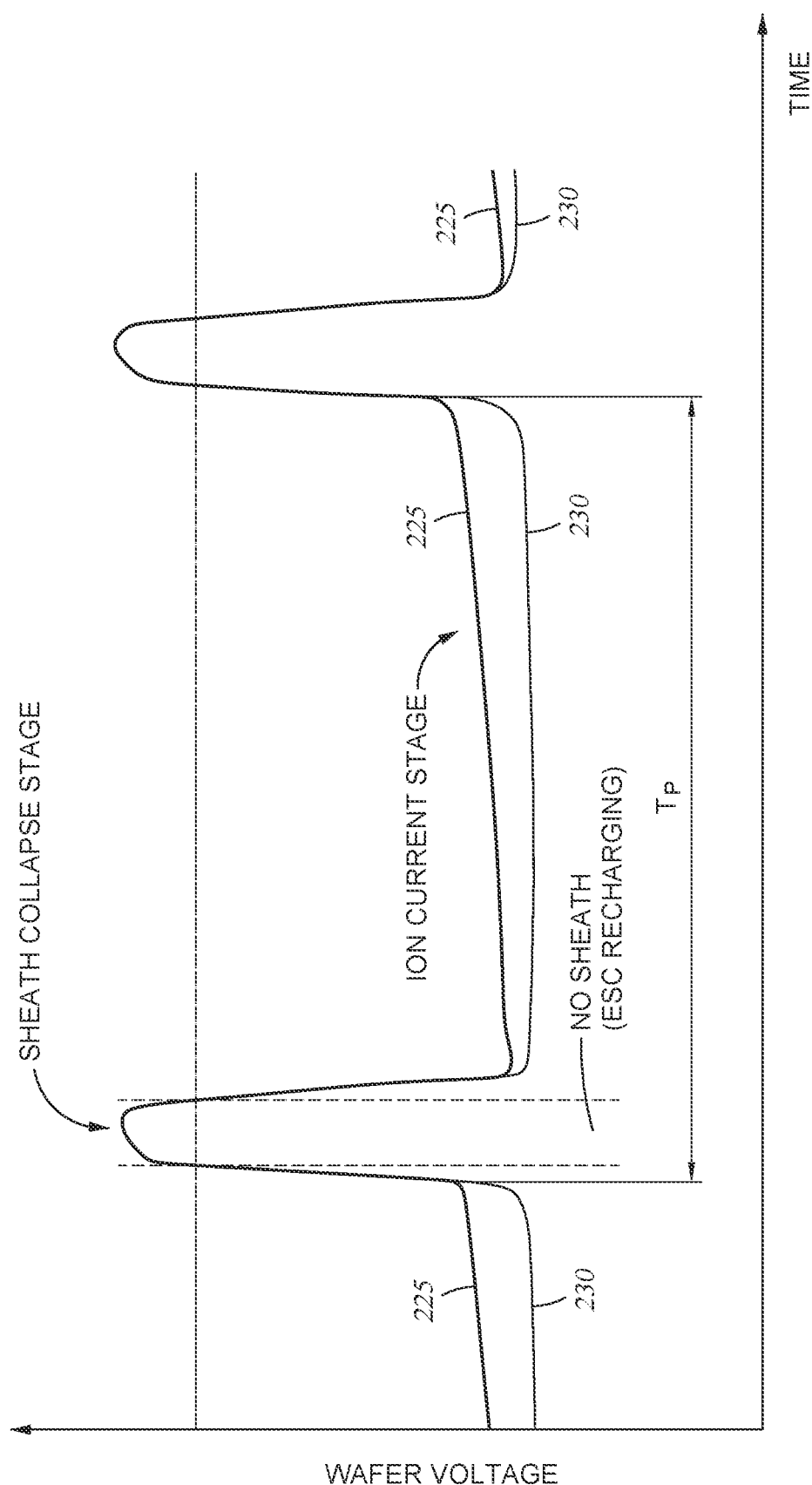
FIG. 2B shows a voltage waveform that is established on a substrate due to a voltage waveform applied to an electrode of a processing chamber.

FIG. 2A shows an example voltage waveform that may be established at an electrode (e.g., the bias electrode 104 and/or support base 107) of a processing chamber. FIG. 2B illustrates an example of different types of voltage waveforms 225 and 230 established at a substrate due to different voltage waveforms, similar to the voltage waveform shown in FIG. 2A, that are separately established at an electrode within the processing chamber. The waveforms include two stages: an ion current stage and a sheath collapse stage, as shown. At the beginning of the ion current stage, a drop in substrate voltage creates a high voltage sheath above the substrate, accelerating positive ions to the substrate. In aspects, the drop of the substrate voltage may be boosted using a capacitive element (e.g., the capacitive element 152) as a source for bulk electrons. The voltage boost may reduce the bulk electrons consumed from the plasma and improve the sustainability and stability of the plasma during the etching process.

The positive ions that bombard the surface of the substrate during the ion current stage deposit a positive charge on the substrate surface, which if uncompensated causes a gradually increasing substrate voltage during the ion current stage, as illustrated by voltage waveform 225 in FIG. 2B. However, the uncontrolled accumulation of positive charge on the substrate surface undesirably gradually discharges the sheath and chuck capacitors, slowly decreasing the sheath voltage drop and bringing the substrate potential closer to zero, as illustrated by voltage waveform 225. The accumulation of positive charge results in the voltage droop in the voltage waveform established at the substrate (FIG. 2B). However, a voltage waveform that is established at the electrode that has a negative slope during the ion current stage, as shown in FIG. 2A, can be generated so as to establish a square shaped region (e.g., near zero slope) for an established substrate voltage waveform, as shown by curve 230 in FIG. 2B. Implementing the slope in the waveform established at the electrode during the ion current stage may be referred to as ion current compensation. The voltage difference between the beginning and end of the ion current phase determines an ion energy distribution function (IEDF) width. The greater the voltage difference, the wider the IEDF width. To achieve monoenergetic ions and a narrower IEDF width, operations are performed to flatten the substrate voltage waveform in the ion current phase using the ion current compensation. In some embodiments of the present disclosure, an RF signal is overlaid on the voltage waveform shown in FIG. 2A.

Figure 3:
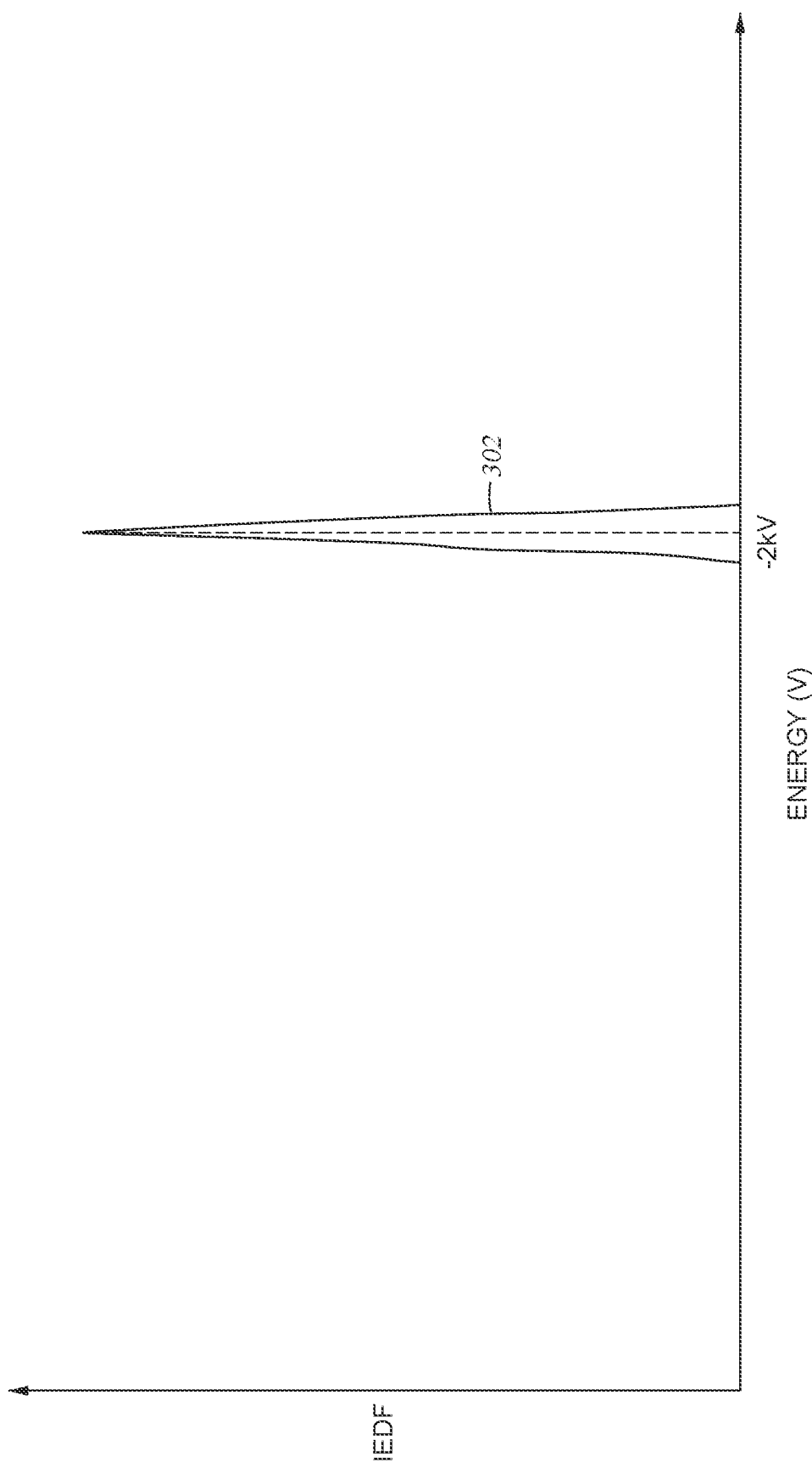
FIG. 3 illustrates an example ion energy distribution (IED).

FIG. 3 is a graph illustrating an IED function (IEDF), in accordance with certain embodiments of the present disclosure. As shown, the IEDF includes a mono-energy peak 302 that may be produced using a specific waveform at the electrode during the ion current compensation stage. The energy associated with the energy peak may be less than a few hundred eVs (e.g., less 1K eV). In certain cases, the energy associated with the energy peak may be a few hundred eVs to tens of thousands eVs, depending on aspect ratio of the feature to be formed in substrate. For instance, in some cases, the energy associated with the energy peak may be between 4 k eV to 10 k eV. Some embodiments are directed to techniques for implementing the ion energy distribution shown in FIG. 3 or other suitable ion energy distributions, for example, as depicted in FIG. 8B.

Voltage Boost for Substrate Processing

Certain embodiments of the present disclosure are generally directed to techniques and apparatus for boosting the voltage at an electrode, such as a bias electrode (e.g., the bias electrode 104 depicted in FIG. 1) and/or a support base (e.g., the support base 107 depicted in FIG. 1), of a processing chamber. The voltage boost described herein may reduce the consumption of bulk electrons from the plasma and facilitate desirable plasma-assisted etching process results.

FIG. 4 is a functionally equivalent, simplified electrical circuit 400 of a plasma processing system (e.g., the processing system 10) that may establish a voltage boost at an electrode, in accordance with certain embodiments of the present disclosure. As shown, the electrical circuit 400 may include switches 402a-402f (collectively referred to as switches 402 and labeled as S1-S6), a voltage source 404, a current source 406, a capacitive element 152, an equivalent capacitance of the substrate support 105 (labeled as $C_{ESC}$), an input node 408 (representative of the bias electrode 104 and/or support base 107 in the processing chamber), and a complex load 410, which may be representative of a standard electrical plasma model as further described herein. In aspects, the processing may include a substrate support (e.g., the substrate support 105) that comprises a dielectric layer (e.g., the dielectric material of the substrate support 105) disposed over the electrode (e.g., the bias electrode 104 and/or support base 107).

In the electrical circuit 400, a voltage boost on the pulsed voltage from the voltage source 404 and/or current source 406 may be established at an electrode (which may be represented by the input node 408) using the capacitive element 152 during a portion of the process of establishing the waveform at the electrode, such as the waveform depicted in FIG. 2A. The electrical circuit 400 illustrates a simplified model of the interaction among the waveform generator assembly (which may be represented by the voltage source 404 and/or current source 406), capacitive element 152, and certain elements (e.g., the substrate support and plasma) within the processing chamber 100, and generally illustrate the basic elements used during operation of the processing chamber 100. For clarity purposes, the following definitions are used throughout the present disclosure: (1) unless a reference is specified, all potentials are referenced to ground; (2) the voltage at any physical point (like a substrate or a biasing electrode) is likewise defined as the potential of this point with respect to ground (zero potential point); (3) the cathode sheath is implied to be an electron-repelling, ion-accelerating sheath that corresponds to a negative substrate potential with respect to plasma; (4) the sheath voltage (also referred to sometimes as "sheath voltage drop"), $V_{sh}$, is defined as the absolute value of the potential difference between the plasma and the adjacent surface (e.g. of the substrate or the chamber wall); and (5) the substrate potential is the potential at the substrate surface facing the plasma.

The complex load 410 is depicted as a standard electrical plasma model that represents the processing plasma 101 as three series elements. The first element being an electron-repelling cathode sheath (which sometimes may also be referred to as the "plasma sheath" or merely the "sheath") adjacent to the substrate 103. The cathode sheath is represented by a conventional three-part circuit element comprising: (a) the diode $D_{SH}$, which when open represents the sheath collapse, (b) the current source $I_i$, representing the ion current flowing to the substrate in the presence of the sheath, and (c) the capacitor $C_{SH}$ (e.g., ~100-300 pF), which represents the sheath for the main portion of the biasing cycle (e.g., the ion current stage of the waveform depicted in FIG. 2A), during which the ion acceleration and the etching occur. The second element being a bulk plasma, which is represented by a single resistor $R_{plasma}$ (e.g., resistor 412=~5-10 Ohms). The third element being an electron-repelling wall sheath forming at the chamber walls. The wall sheath is likewise represented by a three-part circuit element comprising: (a) the diode $D_{wall}$, (b) the current source $I_{iwall}$ representing the ion current to the wall, and (c) the capacitor $C_{wall}$ (e.g., ~5-10 nF), which represents the wall sheath primarily during the ESC recharging phase of the waveform at the electrode. The interior surface of the grounded metal walls can also be coated with a thin layer of a dielectric material, which may provide a capacitance (not shown), such as ~300-1000 nF, coupled in series between the complex load 410 and the ground node 414. The parasitic and stray capacitances of the ESC assembly (e.g., the substrate support 105) and the inductance of the ESC assembly may not be critical to the voltage boost scheme described herein and are not depicted in FIG. 4. In certain cases, these factors (among others) may be considered in determining the values of certain electrical components (such as the capacitance of the capacitive element 152, capacitance of $C_{ESC}$, etc.) and/or the characteristics (e.g., voltage levels, duration, and/or the RF signal) of the waveform established at the electrode.

The capacitive element 152 may be implemented as one or more capacitors, such as a ceramic capacitor and/or a multi-layered dielectric capacitor. For example, the capacitive element 152 may include multiple capacitors coupled together in a network, such as a parallel network and/or series network. In certain cases, the capacitive element 152 may be rated to operate at high voltages, such as voltage levels above 10 kV. The capacitive element 152 may have a capacitance within a range of 500 picofarads (pF) to 1 nanofarad (nF). The capacitance value of the capacitive element 152 may be close to or higher than $C_{ESC}$ and/or $C_{SH}$. That is, the capacitive element may have a capacitance equal to or greater than at least one of a substrate support capacitance (e.g., $C_{ESC}$) or a sheath capacitance (e.g., $C_{SH}$) of the processing chamber.

The capacitive element 152 may be selectively coupled to the electrode (e.g., the input node 408) of the processing chamber via at least one of the switches 402 (e.g., the switch 402c). The capacitive element 152 may be selectively coupled to the voltage source 404 and the ground node 414, for example, via at least one of the switches 402 (e.g., the switches 402d, 402e, and 402f). The capacitive element 152 and the voltage source 404 may be selectively coupled in parallel with the electrode (e.g., the input node 408). That is, the capacitive element 152 and the voltage source 404 may be selectively coupled to the electrode in parallel with each other. In certain aspects, the capacitive element 152 is a separate electrical component from the substrate support capacitance ($C_{ESC}$) and/or sheath capacitance ($C_{SH}$). In certain cases, the capacitive element 152 may be integrated with and/or co-located with the waveform generator assembly 150, such as the voltage source 404 and/or current source 406. In certain cases, the capacitive element 152 may be integrated with and/or co-located with the substrate support capacitance ($C_{ESC}$) and/or sheath capacitance ($C_{SH}$) to provide a suitable boost voltage as described herein.

The capacitive element 152 may provide a source for bulk electrons that is separate from the plasma. In certain cases, the capacitive element 152 may improve the sustainability and stability of the plasma by reducing the bulk electrons consumed from the plasma to establish the DC bias at the electrode.

The switches 402 may be implemented as high voltage solid-state relays. In certain cases, the switches 402 may be implemented as a high voltage multiplexer and/or demultiplexer. In this example, the switches 402 may include a first switch 402a, second switch 402b, third switch 402c, fourth switch 402d, fifth switch 402e, and sixth switch 402f. The first switch 402a may be coupled between the voltage source 404 and the input node 408, which may be electrically coupled to the electrode or representative of the electrode. The second switch 402b may be coupled between the input node 408 and the ground node 414. The third switch 402c may be coupled between a first terminal 416 of the capacitive element 152 and the input node 408. The fourth switch 402d may be coupled between a second terminal 418 of the capacitive element 152 and the input node 408. The fifth switch 402e may be coupled between the first terminal 416 of the capacitive element 152 and the ground node 414. The sixth switch 402f may be coupled between the second terminal 418 of the capacitive element 152 and the ground node 414.

In certain cases, the state of the switches 402 (e.g., opened or closed) may be controlled by the system controller 126. For example, the system controller 126 may be in communication with control inputs (not shown) of the switches 402, such that control signals from the system controller 126 toggle the states of the switches 402. The system controller 126 may control the individual state of each switch 402 with a separate control signal applied to the respective switch. As further described herein with respect to FIGS. 5 and 6A-6C, the switches 402 may be configured to couple the capacitive element 152 and the voltage source 404 to the electrode (e.g., the input node 408) during a first phase (which may be referred to as the ESC recharging phase), couple the capacitive element 152 and the electrode to the ground node 414 during a second phase (which may be referred to as the voltage negation phase), and couple the capacitive element 152 to the electrode during a third phase (which may be referred to as the voltage boost phase). In aspects, the second phase may occur after the first phase, and the third phase may occur after the second phase. For certain aspects, the switches 402 may decouple the electrode from the capacitive element 152 and the voltage source 404 during the second phase and decouple the electrode from the ground node during the third phase.

The voltage source 404 may be a component of a waveform generator assembly (e.g., the waveform generator assembly 150). That is, the waveform generator assembly may include the voltage source 404, which may include a pulsed-voltage DC waveform generator and/or RF generator (also referred to as an RF signal generator). The voltage source 404 may be selectively coupled to the electrode (e.g., the input node 408) via one of the switches 402 (e.g., the switch 402a). For example, the switch 402a may be coupled in series between the voltage source 404 and the input node 408.

Similarly, the current source 406 may be a component of the waveform generator assembly. The current source 406 may be used to implement the ramp voltage during the ion current stage, for example, as described herein with respect to FIG. 2A. The current source may be configured to apply an ion compensation current to the processing chamber (e.g., the electrode) during a fourth phase (e.g., the ion current stage as depicted in FIG. 2A). In aspects, the switches 402 may be configured to couple the capacitive element 152 to the processing chamber (e.g., the electrode) during the fourth phase, which may occur after the third phase. The current source 406 may be coupled to the electrode. In certain cases, the voltage source 404, current source 406, and capacitive element 152 may be coupled in parallel to the electrode (e.g., the input node 408).

Those of skill in the art will understand that the electrical circuit 400 is merely an example, and other electrical circuits (such as the circuits depicted in FIGS. 9 and 10) may be used in addition to or instead of the circuit illustrated to provide the voltage boost at the electrode and reduce the bulk electron consumption from the plasma. While the examples depicted in the present disclosure are described herein with respect to using a positive voltage pulse for the substrate processing to facilitate understanding, aspects of the present disclosure may also be applied to using a negative voltage pulse to establish the waveform at the electrode.

Figure 5:
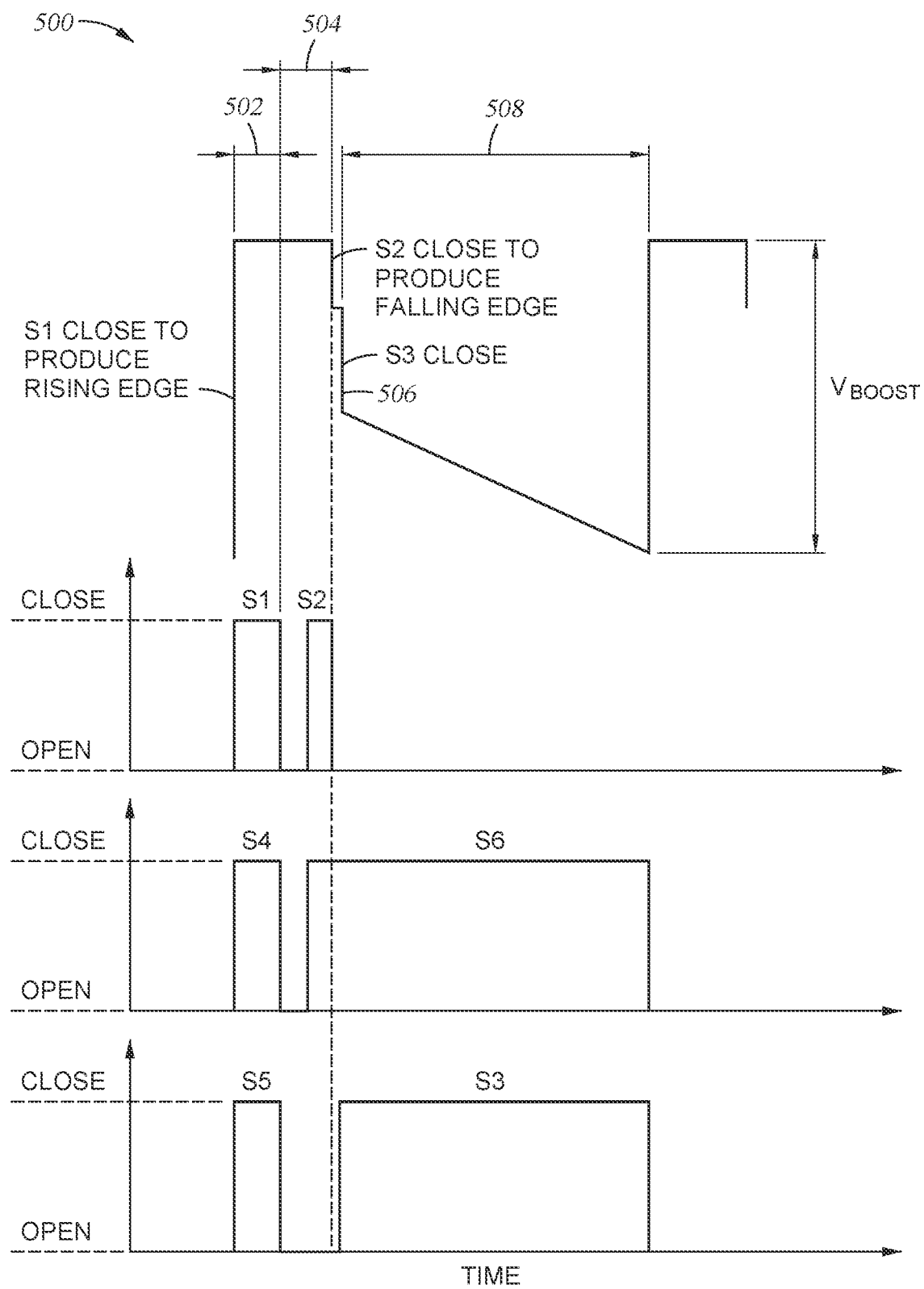
FIG. 5 is a timing diagram illustrating state of switches of the plasma processing system, in accordance with certain embodiments of the present disclosure.
Figure 6A:
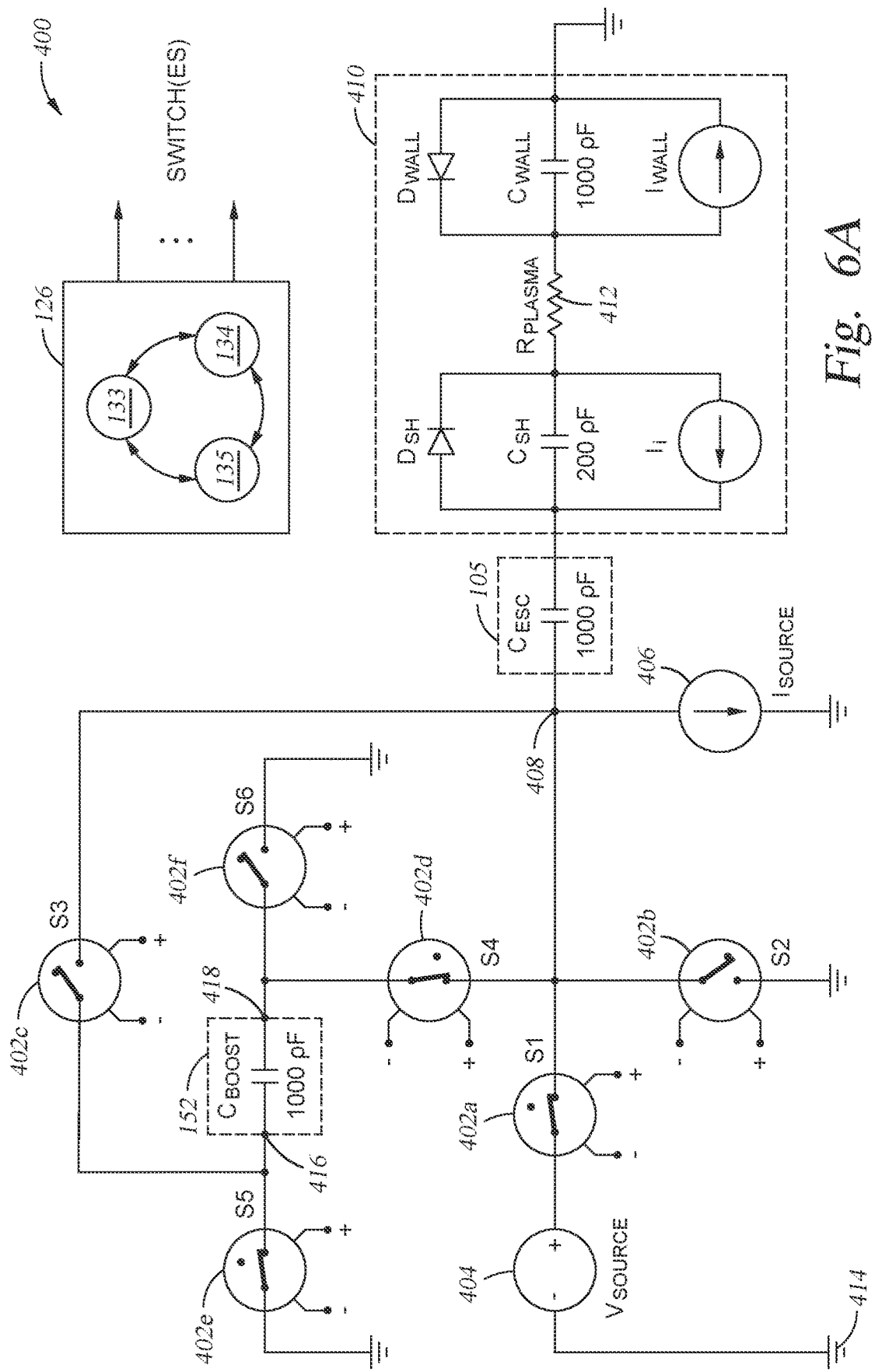
FIGS. 6A-6C are circuit diagrams illustrating the states of the switches during corresponding phases depicted in FIG. 5, in accordance with certain embodiments of the present disclosure
Figure 6B:
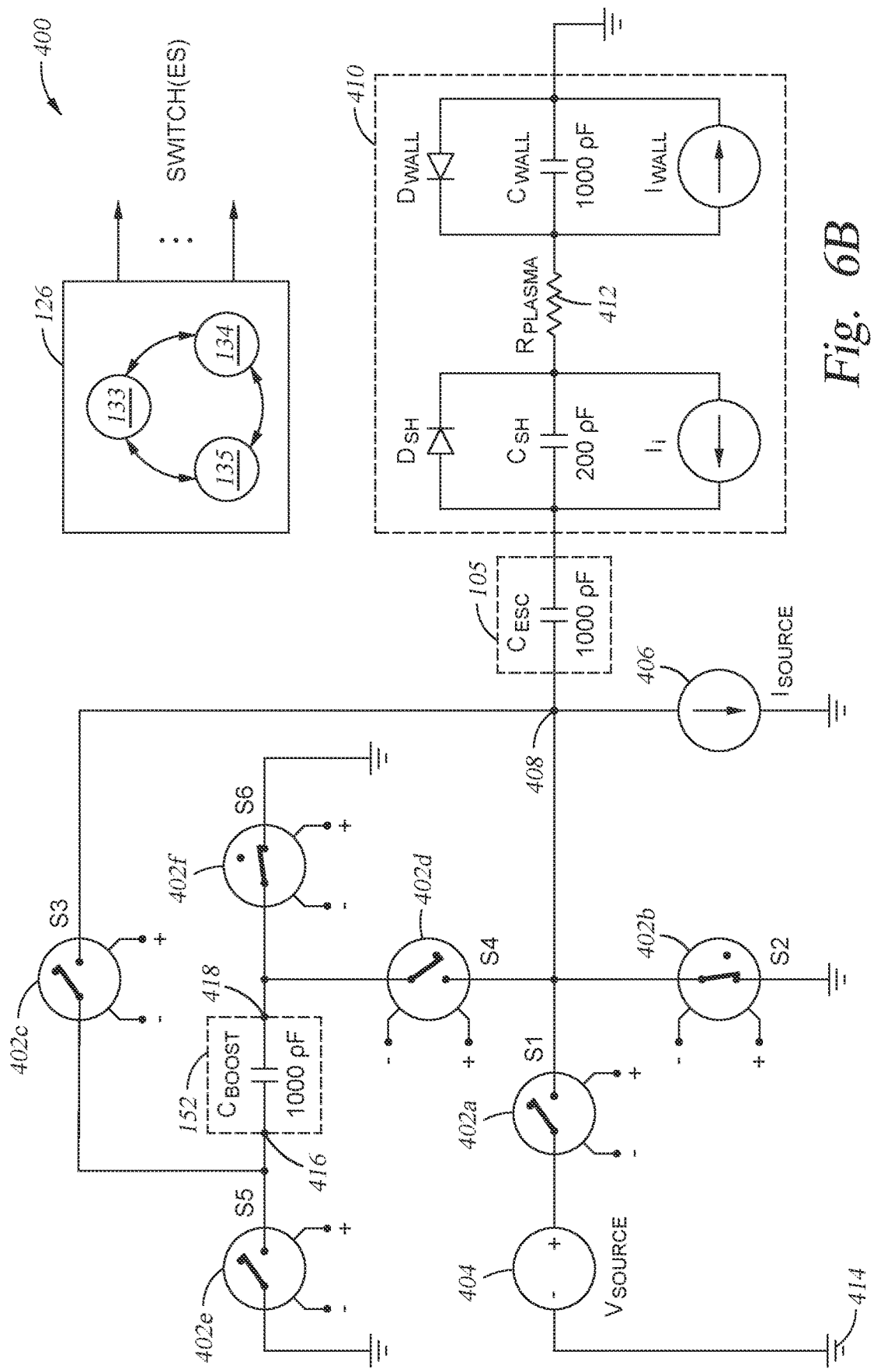
Figure 6C:
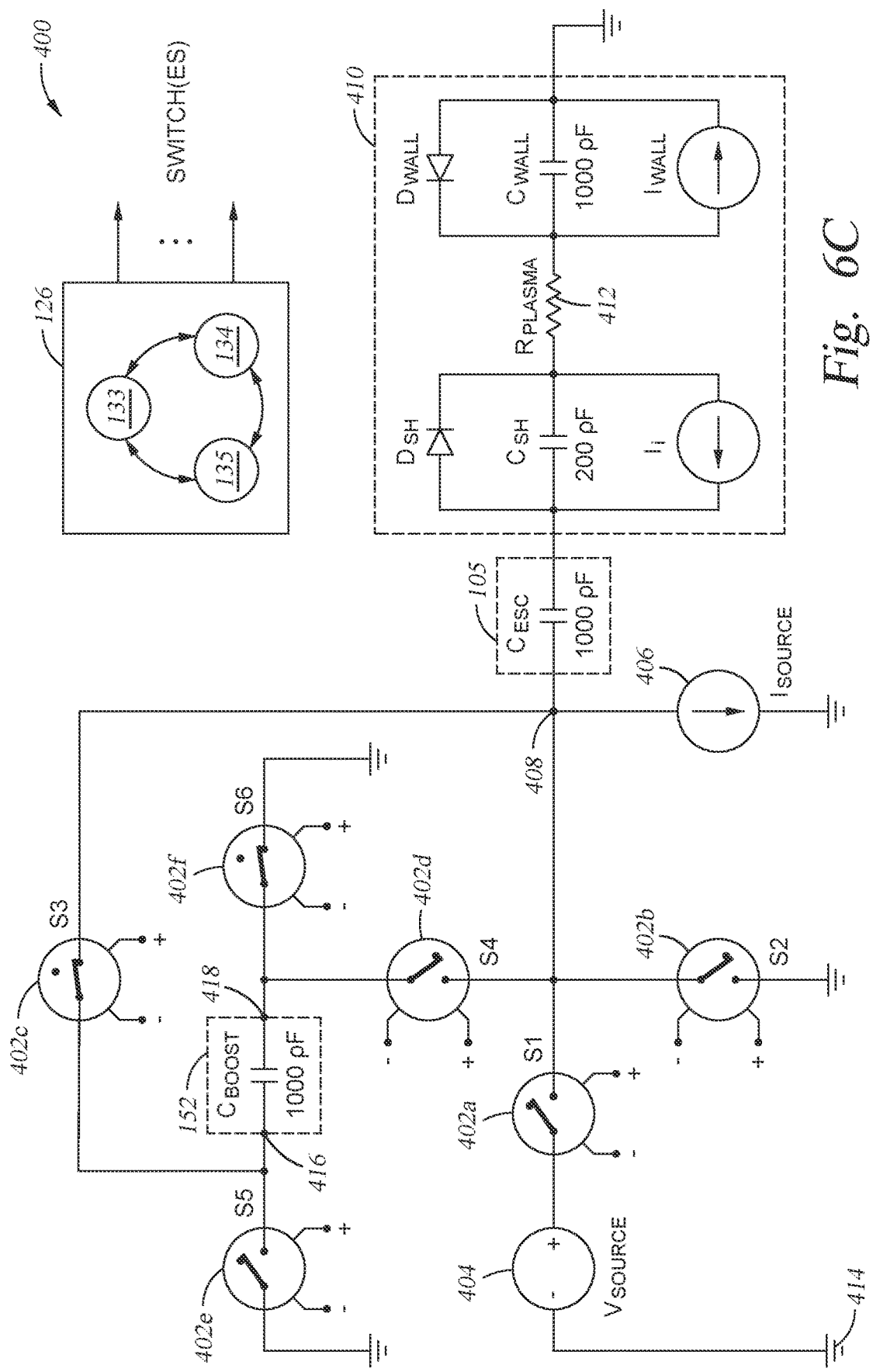

FIG. 5 is a timing diagram 500 illustrating states of the switches 402 (labeled as S1-S6, respectively) of the electrical circuit 400, and FIGS. 6A-6C are circuit diagrams illustrating the states of the switches 402 during corresponding phases depicted in FIG. 5, in accordance with certain embodiments of the present disclosure.

Referring to FIG. 5, the waveform at the electrode may be established in a first phase 502, a second phase 504, a third phase 506, and a fourth phase 508. The first phase 502 can take from 20 nanoseconds (ns) to 2000 ns to allow enough electrons to be collected at the wafer surface. The second phase 504 and/or the third phase 506 can take from tens of nanoseconds to hundreds of nanoseconds, such as 20 ns to 500 ns. The fourth phase 508 can take greater than 50% of the waveform cycle, such as 85~90% of the waveform cycle. The frequency of the voltage function could range from 50 kHz to 5000 kHz.

During the first phase 502, switches 402a, 402d, and 402e (S1, S4, and S5) are closed to charge the substrate support 105 ($C_{ESC}$) and plasma sheath capacitance(s) ($C_{SH}$ and $C_{WALL}$), as well as the capacitive element 152 ($C_{BOOST}$), as shown in FIG. 6A. The charging time for these capacitors may be shorter or longer than the duration depicted in FIG. 5. During the first phase 502, the first switch 402a is configured to close; the second switch 402b is configured to open; the third switch 402c is configured to open; the fourth switch 402d is configured to close; the fifth switch 402e is configured to close; and the sixth switch 402f is configured to open.

The capacitive element 152, $C_{ESC}$, and $C_{SH}$ may be charged to a voltage VBOOST during the first phase 502. Plasma bulk electrons are attracted to the wafer surface due to the rising edge of the waveform shown in FIG. 5. The electrons may not establish a negative DC sheath potential yet, for example, due to there being equal amounts of positive charge on the other electrode. An equivalent capacitance depicted as $C_{ESC}$ may form between the wafer surface and the electrode, and there may be an equal amount of positive charge on the electrode to cancel the field generated by those electrons.

During the second phase 504, the second switch 402b and sixth switch 402f are closed as shown in FIG. 6B. The first switch 402a, the fourth switch 402d, and the fifth switch 402e are configured to open during the second phase 504, and the second switch 402b and sixth switch 402f are configured to close during the second phase to couple the second terminal 418 of the capacitive element 152 and the input node 408 to the ground node 414. Effectively, the substrate support capacitance $C_{ESC}$ is coupled to the ground node 414.

As the second switch 402b closes, the potential at the electrode may be forced to the voltage level at the ground node 414 (such as 0 Volts). As a capacitor's voltage drop cannot change instantaneously, the voltage on the wafer surface becomes negative thereby establishing a negative $V_{dc}$ on the wafer surface. For example, with the second switch 402b in a closed state, the voltage at the electrode may be reduced to first voltage level.

The sixth switch 402f closes and pulls the potential of the connected capacitive element 152 to ground. The potential of at the capacitive element 152 becomes a negative voltage. During the second phase 504, the capacitive element 152 may not be coupled to the input node 408 and the substrate support. The negative DC voltage ($V_{dc}$) on the wafer surface after the second switch 402b closes can be approximated by using the magnitude of the falling edge ΔV and the ratio between the $C_{ESC}$ and sheath capacitance $C_{sheath}$:

$$|V_{dc}| = |\Delta V| \times \frac{C_{ESC}}{(C_{ESC} + C_{sheath})} \quad (1)$$

where $C_{sheath}$ is the capacitance of the wafer sheath capacitance ($C_{SH}$) in series with the ground sheath capacitance ($C_{WALL}$). In certain cases, $C_{sheath}$ may be approximated by the wafer sheath capacitance ($C_{SH}$) due to the ground sheath capacitance ($C_{WALL}$) being much larger.

During the third phase 506, the third switch 402c and sixth switch 402f are closed as shown in FIG. 6C. The second switch 402b is configured to open, and the third switch 402c is configured to close during the third phase, such that the first terminal 416 of the capacitive element 152 is coupled to the input node 408. With the third switch 402c closed, the capacitive element 152 may further reduce the voltage at the electrode to a second voltage level less than the first voltage level. The third switch 402c connects the capacitive element 152 to the input node 408, which may further enhance $V_{dc}$ on the wafer surface and pull $V_{dc}$ more negative.

The voltage at the electrode may be given by:

$$|V_{dc}| = \left|\Delta V\right| \times \frac{C_{ESC}}{(C_{ESC} + C_{sheath})} + \left|V_{BOOST}\right| \times \frac{C_{ESC}}{(C_{ESC} + C_{sheath})} \quad (2)$$

In certain cases, |Vboost| may be higher than |ΔV|. For example, |Vboost| may be 1750 Volts, and |ΔV| may be 1000 Volts. In this example, the capacitive element 152 may reduce the number of electrons required to accumulate on the wafer surface by 2.75 times for the same amount of $V_{dc}$.

The fourth phase 508 is the ion current compensation phase, which may be implemented as described herein with respect to FIGS. 2A and 2B. During the fourth phase 508, the electrode voltage may have a negative slope to compensate ion current. The states of switches 402 may remain the same as the states established at the end of the third phase 506. That is, the third switch 402c and sixth switch 402f may remain closed during the fourth phase 508.

The oncoming ion current neutralizes the negative discharges on the wafer surface and discharges the sheath capacitor (e.g., $C_{SH}$). The wafer voltage may be kept at a constant voltage to provide single peak IED as described herein with respect to FIGS. 2B and 3. The current source 406 can be used to pump electrons to the circuit to compensate for the ion current. In doing so, the current source establishes a voltage waveform having a negative slope at the electrode. In fourth phase 508, the plasma ions bombard the wafer surface and induce etching reactions. The fourth phase 508 may be considered the etching period and may be made as long as possible to facilitate the desired etching (e.g., 1000 ns to 10,000 ns). The length may be limited by the charging speed of the wafer surface or the maximum voltage of the current source (if current compensation is performed).

The ion compensation current ($I_{ion}$) can be calibrated using ion energy/flux diagnostics or calculated by sampling the electrode voltage (V0) (e.g., to calculate time derivative of V0) and the value of the sheath capacitance:

$$I_{ion} = (C_{sheath} + C_{boost}) \frac{dV0}{dt} \quad (3)$$

where $C_{boost}$ is the capacitance of the capacitive element 152. For example, the first tens to hundreds of the cycles can be used to sample the electrode voltage and calculate Iion for ion current compensation. The current compensation may then be implemented for the subsequent cycles. The current source 406 may be configured to adjust the ion compensation current in response to a change in voltage over time measured at the electrode based at least in part on a capacitance of the capacitive element, for example, as given by Equation (3). An increased capacitance of the capacitive element 152 may slow down the decay of $V_{dc}$. $C_{boost}$ may be made as large as possible in the voltage rating allowed range.

Figure 7:
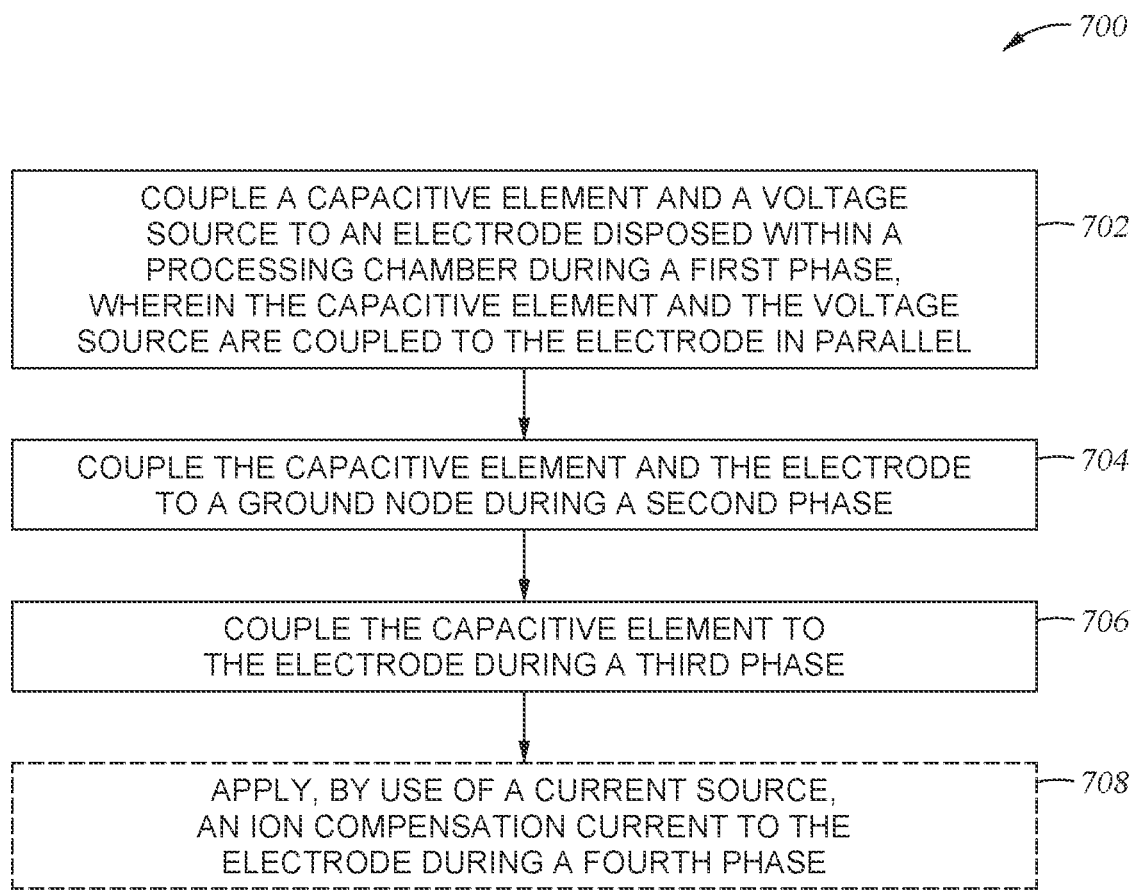
FIG. 7 is a process flow diagram illustrating a method for establishing a boost voltage at an electrode.

FIG. 7 is a process flow diagram illustrating a method 700 for boosting the voltage at the electrode. The method 700 may be performed by a plasma processing system, such as the processing system 10.

At activity 702, a capacitive element (e.g., the capacitive element 152) and a voltage source (e.g., the voltage source 404) may be coupled to an electrode (e.g., represented by the input node 408) disposed within a processing chamber (e.g., the processing chamber 100) during a first phase (e.g., the first phase 502). The capacitive element 152 and the voltage source 404 may be coupled to the electrode in parallel, for example, as depicted in FIG. 4. As an example, with respect to the electrical circuit 400, the first switch 402a, the fourth switch 402d, and the fifth switch 402e may be closed during the first phase. The second switch 402b, the third switch 402c, and the sixth switch 402f are opened during the first phase.

At activity 704, the capacitive element 152 and the electrode may be coupled to a ground node (e.g., the ground node 414) during a second phase (e.g., the second phase 504). During the second phase, the electrode may be decoupled from the voltage source and the capacitive element. As an example, with respect to the electrical circuit 400, the first switch 402a, fourth switch 402d, and fifth switch 402e are opened during the second phase. The second switch 402b and sixth switch 402f are closed during the second phase to couple the capacitive element to the input node (e.g., the input node 408). With the second switch 402b closed, a voltage at the electrode may be reduced to a first voltage level.

At activity 706, the capacitive element 152 may be coupled to the electrode during a third phase (e.g., the third phase 506). During the third phase, the electrode may decoupled from the ground node. As an example, with respect to the electrical circuit 400, the second switch 402b may be opened during the third phase, and the third switch may be closed to couple the first terminal 416 of the capacitive element 152 to the input node 408. With the third switch 402c closed, the voltage at the electrode may be reduced to a second voltage level less than the first voltage level.

At activity 708, a current source (e.g., the current source 406) may apply an ion compensation current to the electrode during a fourth phase (e.g., the fourth phase 508). In aspects, the capacitive element 152 may be coupled to the electrode during the fourth phase. For certain aspects, the current source may adjust the ion compensation current in response to a change in voltage over time measured at the electrode based at least in part on a capacitance of the capacitive element, for example, as given by the Equation (3).

In certain aspects, the method 700 may also include generating a plasma over a substrate supporting surface (e.g., the substrate support surface 105A) of a substrate support (e.g., the substrate support 105) disposed in the processing chamber. The plasma and ion current compensation may facilitate the etching of the substrate as described herein.

In certain aspects, the timing of when the charged capacitive element is coupled to the electrode may be adjusted, for example, to produce multiple ion energies and/or adjust the width of an ion energy in an etching cycle.

Figure 8A:
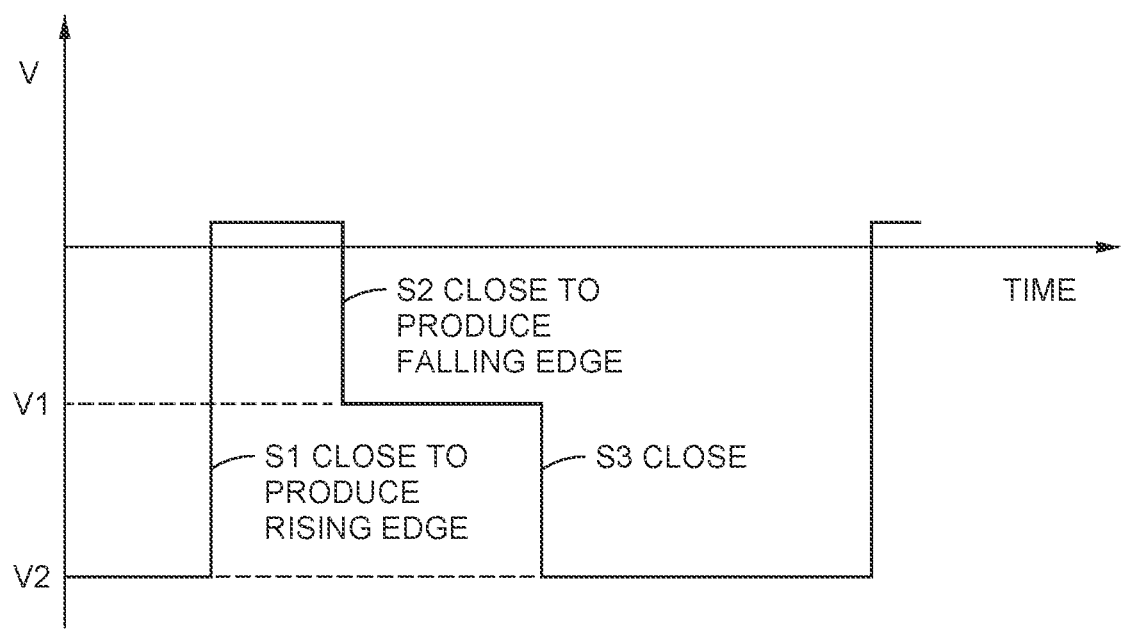
FIG. 8A shows an additional voltage waveform that may be established at an electrode of a processing chamber, in accordance with certain embodiments of the present disclosure.
Figure 8B:
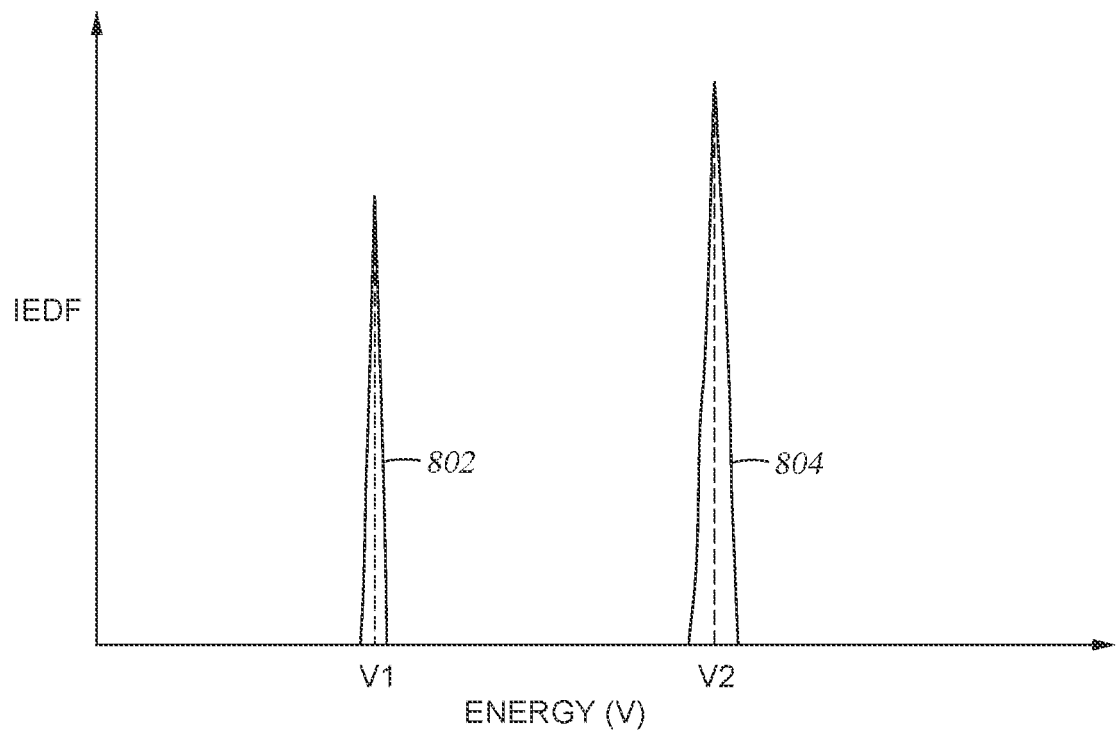
FIG. 8B shows an additional voltage waveform that is established on a substrate due to a voltage waveform applied to an electrode of a processing chamber.

FIG. 8A shows an example voltage waveform that may be established at an electrode (e.g., the bias electrode 104 and/or support base 107) of a processing chamber, in accordance with certain embodiments of the present disclosure. As depicted, closing the third switch 402c in the third phase may be delayed compared to the waveform depicted in FIGS. 2A and 5. For example, the second phase may be have a longer duration than the duration depicted in FIGS. 2A and 5. An IEDF with two ion energies as depicted in FIG. 8B may be produced with the delayed coupling of the capacitive element. As shown, the IEDF includes a low energy peak 802 and a high energy peak 804.

Figure 9:
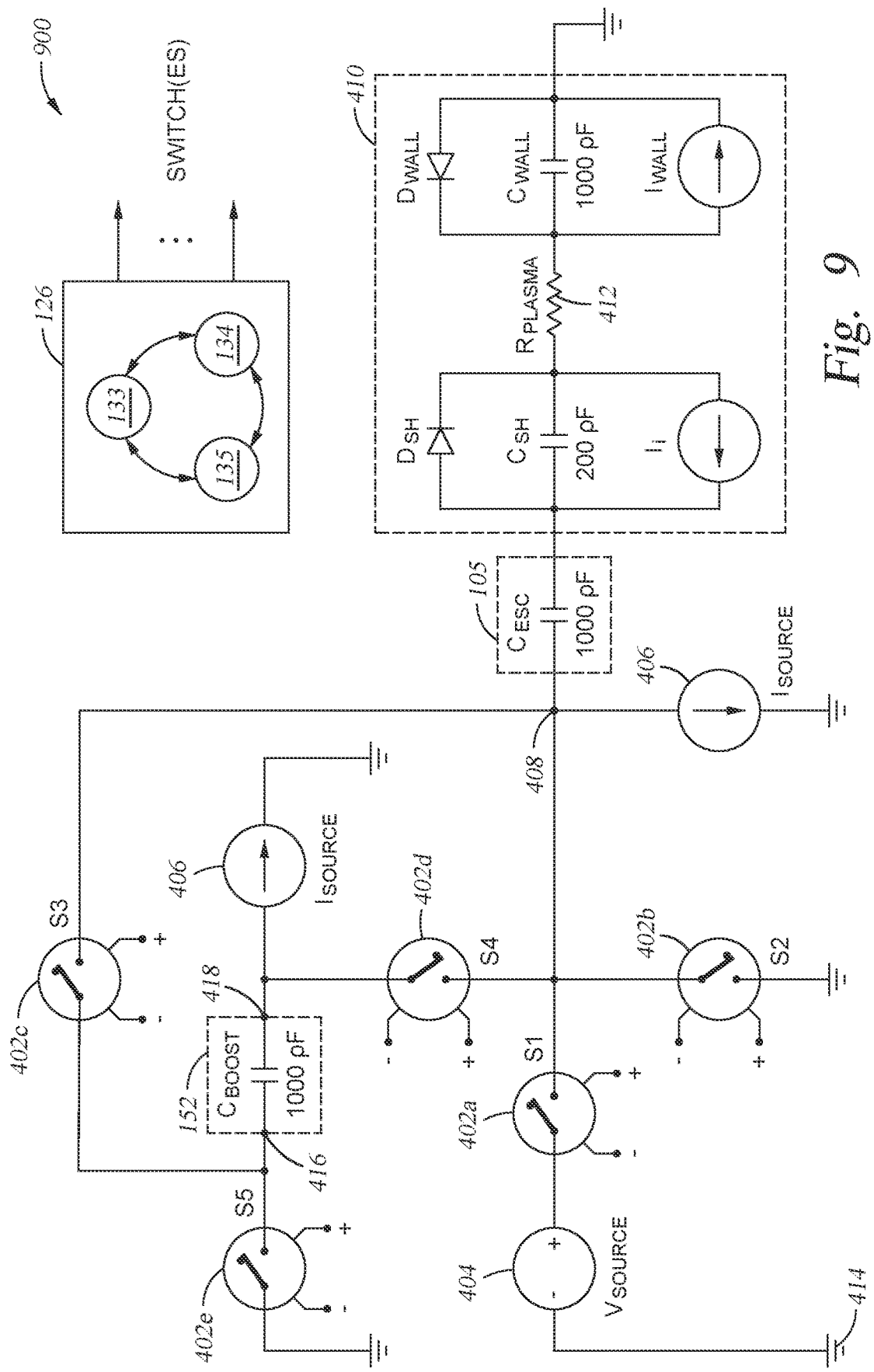
FIG. 9 is an additional functionally equivalent, simplified electrical circuit of a plasma processing system, in accordance with certain embodiments of the present disclosure.

For certain aspects, the current source may be coupled in series with the capacitive element. For example, FIG. 9 is an additional functionally equivalent, simplified electrical circuit 900 of a plasma processing system (e.g., the processing system 10) that may establish a voltage boost at an electrode, in accordance with certain embodiments of the present disclosure. The current source 406 may be selectively coupled to the processing chamber (e.g., the electrode) via the switches 402 (e.g., the third switch 402c), which may be configured to couple the current source to the processing chamber during the fourth phase. In this example, the capacitive element 152 may be selectively coupled in series between the current source 406 and the electrode (e.g., the input node 408). In the electrical circuit 900, the sixth switch 402f may be excluded.

The ion current may be adjusted according to the following expression:

$$I_{ion} = C_{sheath}\frac{dV0}{dt} \quad (4)$$

As a result, the electrical circuit 900 may enable a lower ion current compared to the electrical circuit 400.

Figure 10:
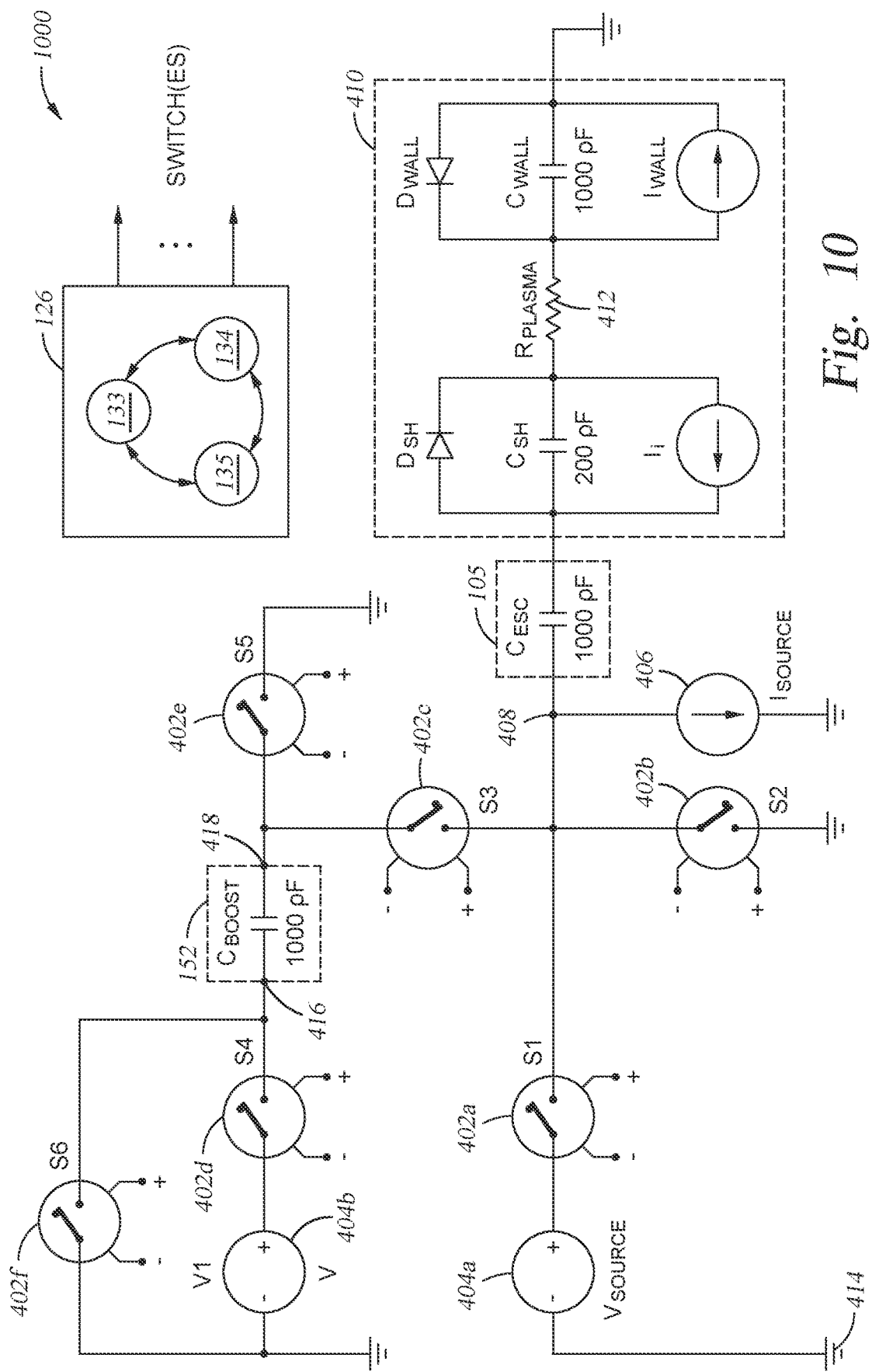
FIG. 10 is an additional functionally equivalent, simplified electrical circuit of a plasma processing system with a separate voltage source for a boost capacitor, in accordance with certain embodiments of the present disclosure.

In certain aspects, a separate voltage source may be used to charge the capacitive element. For example, FIG. 10 is an additional functionally equivalent, simplified electrical circuit 1000 of a plasma processing system (e.g., the processing system 10) that may establish a voltage boost at an electrode, in accordance with certain embodiments of the present disclosure. In the electrical circuit 1000, the voltage source may include a first voltage source 404a selectively coupled to the electrode (e.g., the input node 408) and a second voltage source 404b selective coupled to the capacitive element 152. In this example, the sixth switch 402f may be coupled in parallel with the second voltage source 404b and the fourth switch 402d. The fifth switch 402e may be coupled in series between the capacitive element 152 and the ground node 414.

During the first phase, the first switch 402a, fourth switch 402d, and the fifth switch 402e may be closed, while the second switch 402b, third switch 402c, and sixth switch 402f may be open. During the second phase, the sixth switch 402f and second switch 402b may be closed, while the first switch 402a, third switch 402c, and fourth switch 402d may be open. During the third phase, the third switch 402c and sixth switch 402f may be closed, while the first switch 402a, second switch 402b, and fifth switch 402e may be open.

In certain cases, the capacitive element 152 and the second voltage source 404b may be used to compensate ion current. For example, the third switch 402c may be closed at the middle of the fourth phase to produce a step down in voltage during the ion current compensation stage.

Similar to the concept of Voltage Triplers and Quadruplers, multiple stages of the boost capacitance can be used to further increase the wafer DC voltage. Such embodiments may use more switches and/or relays.

It will be appreciated that the techniques and apparatus described herein may reduce the number of plasma electrons consumed to establish the DC bias. As such, the techniques and apparatus described herein may improve plasma stability and extend the achievable maximum ion energy for substrate processing.

The term "coupled" is used herein to refer to the direct or indirect coupling between two objects. For example, if object A physically touches object B and object B touches object C, then objects A and C may still be considered coupled to one another—even if objects A and C do not directly physically touch each other. For instance, a first object may be coupled to a second object even though the first object is never directly physically in contact with the second object.

While the foregoing is directed to embodiments of the present disclosure, other and further embodiments of the disclosure may be devised without departing from the basic scope thereof, and the scope thereof is determined by the claims that follow.

What is claimed is:

1. A method of processing a substrate, comprising:
    coupling a capacitive element and a voltage source to an electrode disposed within a processing chamber during a first phase, wherein the capacitive element and the voltage source are coupled to the electrode in parallel;
    coupling the capacitive element and the electrode to a ground node during a second phase; and
    coupling the capacitive element to the electrode during a third phase.

2. The method of claim 1, further comprising:
    generating a plasma over a substrate supporting surface of a substrate support disposed in the processing chamber, the substrate support comprising the electrode and a dielectric layer disposed between the electrode and the substrate supporting surface;
    wherein coupling during the second phase further comprises decoupling the electrode from the voltage source and the capacitive element; and
    wherein coupling during the third phase further comprises decoupling the electrode from the ground node.

3. The method of claim 1, wherein coupling during the first phase comprises:
    closing a first switch coupled between the voltage source and an input node that is electrically coupled to the electrode;
    closing a second switch coupled between a first terminal of the capacitive element and the input node; and
    closing a third switch coupled between a second terminal of the capacitive element and the ground node.

4. The method of claim 3, wherein coupling during the first phase further comprises:
    opening a fourth switch coupled between the input node and the ground node;
    opening a fifth switch coupled between the first terminal of the capacitive element and the ground node; and
    opening a sixth switch coupled between the second terminal of the capacitive element and the input node.

5. The method of claim 4, wherein coupling during the second phase comprises:
    opening the first switch, the second switch, and the third switch; and
    closing the fourth switch and the fifth switch to couple the first terminal of the capacitive element and the input node to the ground node.

6. The method of claim 5, wherein coupling during the third phase comprises:
opening the fourth switch; and
closing the sixth switch to couple the second terminal of the capacitive element to the input node.

7. The method of claim 1, further comprising applying, by use of a current source, an ion compensation current to the electrode during a fourth phase.

8. The method of claim 7, wherein the capacitive element is coupled to the electrode during the fourth phase.

9. The method of claim 7, further comprising:
generating a plasma over a substrate supporting surface of a substrate support disposed in the processing chamber, the substrate support comprising the electrode and a dielectric layer disposed between the electrode and the substrate supporting surface; and
wherein applying the ion compensation current comprises adjusting the ion compensation current in response to a change in voltage over time measured at the electrode based at least in part on a capacitance of the capacitive element.

10. The method of claim 1, wherein:
coupling during the second phase comprises reducing a voltage at the electrode to a first voltage level; and
coupling during the third phase comprises reducing the voltage at the electrode to a second voltage level less than the first voltage level.

11. The method of claim 1, further comprising applying, by use of a current source, an ion compensation current to the electrode during a fourth phase, wherein the capacitive element is selectively coupled in series between the current source and the electrode.

12. The method of claim 1, wherein the voltage source comprises a first voltage source selectively coupled to the electrode and a second voltage source selectively coupled to the capacitive element.

13. The method of claim 1, wherein the second phase occurs after the first phase, and the third phase occurs after the second phase.

14. The method of claim 1, wherein the capacitive element has a capacitance within a range of 500 picofarads (pF) to 1 nanofarad (nF).

15. The method of claim 1, wherein the capacitive element has a capacitance equal to or greater than at least one of a substrate support capacitance or a sheath capacitance of the processing chamber.

16. A plasma processing system, comprising:
a plurality of switches;
an electrode disposed within a processing chamber;
a voltage source selectively coupled to the electrode via one of the plurality of switches; and
a capacitive element selectively coupled to the electrode via the one of the plurality of switches, wherein the capacitive element and the voltage source are coupled to the electrode in parallel, and wherein the plurality of switches are configured to:
couple the capacitive element and the voltage source to the electrode during a first phase,
couple the capacitive element and the electrode to a ground node during a second phase, and
couple the capacitive element to the electrode during a third phase.

17. The plasma processing system of claim 16, wherein:
the processing chamber comprises a substrate support that comprises a dielectric layer disposed over the electrode;
wherein the plurality of switches are configured to:
decouple the electrode from the capacitive element and the voltage source during the second phase, and
decouple the electrode from the ground node during the third phase.

18. The plasma processing system of claim 17, wherein the plurality of switches comprise:
a first switch coupled between the voltage source and an input node that is electrically coupled to the electrode, wherein the first switch is configured to close during the first phase;
a second switch coupled between a first terminal of the capacitive element and the input node, wherein the second switch is configured to close during the first phase; and
a third switch coupled between a second terminal of the capacitive element and the ground node, wherein the third switch is configured to close during the first phase.

19. The plasma processing system of claim 18, wherein the plurality of switches comprise:
a fourth switch coupled between the input node and the ground node, wherein the fourth switch is configured to open during the first phase;
a fifth switch coupled between the first terminal of the capacitive element and the ground node, wherein the fifth switch is configured to open during the first phase; and
a sixth switch coupled between the second terminal of the capacitive element and the input node, wherein the sixth switch is configured to open during the first phase.

20. The plasma processing system of claim 19, wherein:
the first switch, the second switch, and the fifth switch are configured to open during the second phase; and
the fourth switch and the fifth switch are configured to close during the second phase to couple the first terminal of the capacitive element and the input node to the ground node.

21. The plasma processing system of claim 20, wherein:
the fourth switch is configured to open during the third phase; and
the sixth switch is configured to close during the third phase to couple the second terminal of the capacitive element to the input node.

22. The plasma processing system of claim 16, further comprising:
a current source coupled to the electrode; and
wherein the current source is configured to apply an ion compensation current to the processing chamber during a fourth phase.

23. The plasma processing system claim 22, wherein the plurality of switches are configured to couple the capacitive element to the processing chamber during the fourth phase.

24. The plasma processing system of claim 22, wherein:
the processing chamber comprises a substrate support that comprises a dielectric layer that is disposed over the electrode; and
the current source is configured to adjust the ion compensation current in response to a change in voltage over time measured at the electrode based at least in part on a capacitance of the capacitive element.

25. The plasma processing system of claim 16, the plurality of switches are configured to:
couple the electrode to the ground node during the second phase to reduce a voltage at the electrode to a first voltage level; and
couple the capacitive element to the electrode during the third phase to reduce the voltage at the first electrode to a second voltage level less than the first voltage level.

26. The plasma processing system of claim 16, further comprising:
- a current source selectively coupled to the processing chamber via the plurality of switches;
- wherein the current source is configured to apply an ion compensation current to the electrode during a fourth phase;
- wherein the plurality of switches are configured to couple the current source to the processing chamber during the fourth phase; and
- wherein the capacitive element is selectively coupled in series between the current source and the electrode.

27. The plasma processing system of claim 16, wherein the second phase occurs after the first phase, and the third phase occurs after the second phase.

28. The plasma processing system of claim 16, wherein the capacitive element has a capacitance within a range of 500 picofarads (pF) to 1 nanofarad (nF).

29. The plasma processing system of claim 16, wherein the capacitive element has a capacitance equal to or greater than at least one of a substrate support capacitance or a sheath capacitance of the processing chamber.

* * * * *